US012623313B2

(12) United States Patent
Yamawaki et al.

(10) Patent No.: US 12,623,313 B2
(45) Date of Patent: May 12, 2026

(54) SUBSTRATE PROCESSING APPARATUS AND SUBSTRATE PROCESSING METHOD

(71) Applicant: Tokyo Electron Limited, Tokyo (JP)

(72) Inventors: Yohei Yamawaki, Kumamoto (JP);
Seiji Nakano, Kumamoto (JP);
Yoshihiro Kawaguchi, Kumamoto (JP);
Munehisa Kodama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 1195 days.

(21) Appl. No.: 17/616,218

(22) PCT Filed: May 14, 2020

(86) PCT No.: PCT/JP2020/019299
§ 371 (c)(1),
(2) Date: Dec. 3, 2021

(87) PCT Pub. No.: WO2020/246214
PCT Pub. Date: Dec. 10, 2020

(65) Prior Publication Data
US 2022/0234160 A1 Jul. 28, 2022

(30) Foreign Application Priority Data
Jun. 4, 2019 (JP) ................................. 2019-104802

(51) Int. Cl.
*B24B 7/02* (2006.01)
*B08B 5/00* (2006.01)
(Continued)

(52) U.S. Cl.
CPC ................ *B24B 9/065* (2013.01); *B08B 5/00* (2013.01); *B24B 7/02* (2013.01); *B24B 7/04* (2013.01);
(Continued)

(58) Field of Classification Search
CPC ........... B24B 55/12; B24B 55/06; B24B 7/02; B24B 7/04; B24B 9/00
(Continued)

(56) References Cited

U.S. PATENT DOCUMENTS

| | | | | | |
|---|---|---|---|---|---|
| 5,351,360 | A | * | 10/1994 | Suzuki | ...................... B08B 1/36 |
| | | | | | 15/97.1 |
| 5,487,398 | A | * | 1/1996 | Ohmi | ................ H01L 21/67051 |
| | | | | | 257/E21.228 |

(Continued)

FOREIGN PATENT DOCUMENTS

| | | | |
|---|---|---|---|
| JP | H9216152 A | 8/1997 | |
| JP | 2006066643 A | * | 3/2006 |

(Continued)

OTHER PUBLICATIONS

International Search Report of PCT/JP2020/019299 dated Aug. 11, 2020.

*Primary Examiner* — Kaj K Olsen
*Assistant Examiner* — Richard Z. Zhang
(74) *Attorney, Agent, or Firm* — Shih IP Law Group, PLLC

(57) ABSTRACT

A substrate processing apparatus includes a chuck configured to hold a substrate horizontally; a processing unit configured to press a processing tool against an outer periphery of the substrate held by the chuck to process the substrate; and a lower cup configured to collect a processing residue falling from the substrate over an entire circumference of the substrate. The lower cup is provided with a discharge opening through which the processing residue is discharged.

18 Claims, 21 Drawing Sheets

(51) Int. Cl.

| | |
|---|---|
| *B24B 7/04* | (2006.01) |
| *B24B 9/06* | (2006.01) |
| *B24B 55/06* | (2006.01) |
| *B24B 55/12* | (2006.01) |
| *H01L 21/304* | (2006.01) |
| *H01L 21/67* | (2006.01) |

(52) U.S. Cl.
CPC .............. *B24B 55/06* (2013.01); *B24B 55/12* (2013.01); *H01L 21/304* (2013.01); *H01L 21/67092* (2013.01)

(58) Field of Classification Search
USPC .......................................................... 451/28
See application file for complete search history.

(56) References Cited

U.S. PATENT DOCUMENTS

2006/0014383 A1* 1/2006 Otsuki ..................... B28D 5/00
257/E21.237

2008/0166881 A1* 7/2008 Taniyama ........... C23C 16/4412
438/758
2009/0113656 A1* 5/2009 Yoon ................. H01L 21/67046
15/302
2012/0261076 A1 10/2012 Moriceau
2013/0156950 A1* 6/2013 Yamada .............. C23C 16/4405
427/248.1
2016/0365238 A1* 12/2016 Iwahata ............ H01L 21/02307
2017/0189932 A1* 7/2017 Hung .................. H01L 21/6715
2018/0294179 A1* 10/2018 Wang ................ H01L 21/67051
2020/0056932 A1* 2/2020 Iwasa ..................... B23Q 11/00
2022/0219281 A1* 7/2022 Anderson .............. B24B 41/06
2023/0103899 A1* 4/2023 Fukai ................. B23Q 11/0067
408/199

FOREIGN PATENT DOCUMENTS

| | | | |
|---|---|---|---|
| JP | 2011054785 A | * | 3/2011 |
| JP | 2014054694 A | | 3/2014 |
| WO | WO2020121587 A1 | * | 6/2020 |

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2020/019299 filed on May 14, 2020, which claims the benefit of Japanese Patent Application No. 2019-104802 filed on Jun. 4, 2019, the entire disclosures of which are incorporated herein by reference.

TECHNICAL FIELD

The various aspects and embodiments described herein pertain generally to a substrate processing apparatus and a substrate processing method.

BACKGROUND

Patent Document 1 discloses a technique of grinding an outer periphery of a semiconductor wafer into an L-shape. The semiconductor wafer is formed by bonding two silicon wafers together, and a bevel of one of the silicon wafers is removed by the grinding. The purpose of removing the bevel is to suppress chipping or the like.

PRIOR ART DOCUMENT

Patent Document 1: Japanese Patent Laid-open Publication No. H09-216152

DISCLOSURE OF THE INVENTION

Means for Solving the Problems

In an exemplary embodiment, a substrate processing apparatus includes a chuck configured to hold a substrate horizontally; a processing unit configured to press a processing tool against an outer periphery of the substrate held by the chuck to process the substrate; and a lower cup configured to collect a processing residue falling from the substrate over an entire circumference of the substrate. The lower cup is provided with a discharge opening through which the processing residue is discharged.

BRIEF DESCRIPTION OF THE DRAWINGS

FIG. 1 is a plan view illustrating a thinning system according to an exemplary embodiment.

FIG. 4B is a plan view illustrating positions of a first division surface and a second division surface shown in FIG. 4A.

FIG. 9A is a cross sectional view taken along a line IX-IX of FIG. 7, showing an opening position of an upper cover.

FIG. 13 is an enlarged view of a processing unit shown in FIG. 9B.

FIG. 16 is a cross sectional view showing a state in which a degree of horizontality is measured by a measuring device according to the exemplary embodiment.

DETAILED DESCRIPTION

Figure 2:
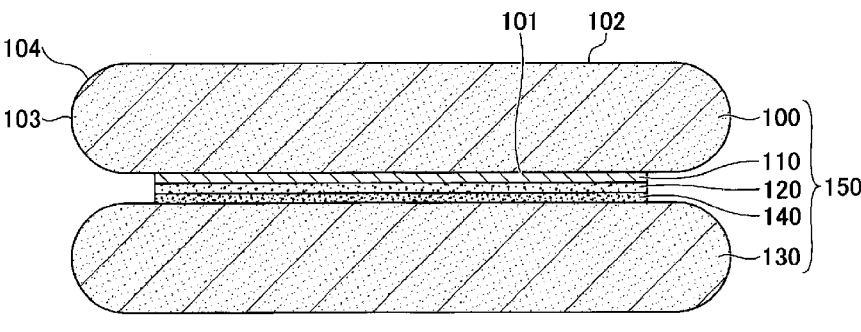
FIG. 2 is a cross sectional view illustrating a processing target substrate, a device layer and a support substrate according to the exemplary embodiment.

Hereinafter, exemplary embodiments of the present disclosure will be described with reference to the accompanying drawings. In the various drawings, same or corresponding parts will be assigned same or corresponding reference numerals, and redundant description will be omitted. In the present specification, the X-axis direction, the Y-axis direction and the Z-axis direction are orthogonal to each other. The X-axis direction and the Y-axis direction are horizontal directions, whereas the Z-axis direction is a vertical direction.

Figure 1:
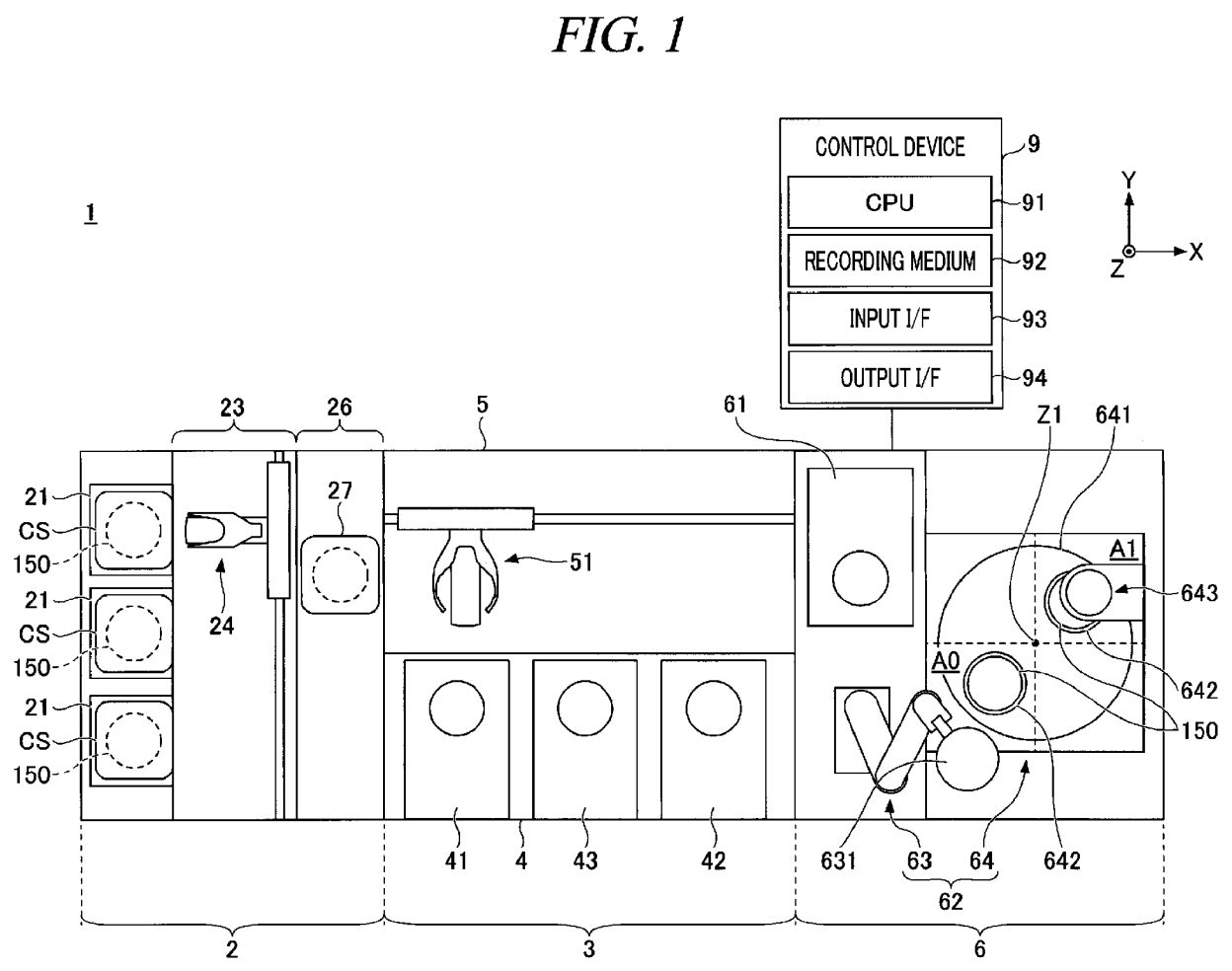

FIG. 1 is a plan view illustrating a thinning system according to an exemplary embodiment. The thinning system 1 is configured to thin a processing target substrate 100. Further, the thinning system 1 is also configured to remove a bevel 104 of the processing target substrate 100 before thinning the processing target substrate 100. The bevel 104 refers to a chamfered portion. Although the bevel 104 is a R-chamfered portion in FIG. 2, it may be a C-chamfered portion.

FIG. 2 is a cross sectional view illustrating a processing target substrate, a device layer and a support substrate according to the exemplary embodiment. The processing target substrate 100 is a semiconductor substrate such as, but not limited to, a silicon wafer or a compound semiconductor wafer. A device layer 110 is previously formed on one side of the processing target substrate 100. The device layer 110 is, for example, an electronic circuit. Hereinafter, a main surface of the processing target substrate 100 on which the device layer 110 is formed will be referred to as a first main surface 101. Further, a main surface opposite to the first main surface 101 will be referred to as a second main surface 102. The second main surface 102 is brought closer to the first main surface 101 by the thinning of the processing target substrate 100.

An oxide layer 120 is formed on a surface of the device layer 110 on the opposite side to the processing target substrate 100. The oxide layer 120 is formed to be smaller than the processing target substrate 100 in diameter in order to smoothly remove the bevel 104 of the processing target substrate 100. The oxide layer 120 is, for example, a silicon oxide layer. The silicon oxide layer is formed of, for example, tetraethyl orthosilicate (TEOS).

Like the processing target substrate 100, a support substrate 130 is a semiconductor substrate such as a silicon wafer or a compound semiconductor wafer. The support substrate 130 is bonded to the processing target substrate 100 with the device layer 110 therebetween. An oxide layer 140 is formed on a surface of the support substrate 130 facing the device layer 110. The oxide layer 140 is formed in the same manner as the oxide layer 120. In addition, a non-illustrated device layer may be formed between the oxide layer 140 and the support substrate 130.

A combined substrate 150 includes the processing target substrate 100, the device layer 110, the two oxide layers 120 and 140, and the support substrate 130. The two oxide layers 120 and 140 are bonded to each other by a heat treatment. In addition, the combined substrate 150 may have only one of the two oxide layers 120 and 140.

As depicted in FIG. 1, the thinning system 1 includes a carry-in/out station 2, a first processing station 3, a second processing station 6, and a control device 9. The carry-in/out station 2, the first processing station 3, and the second processing station 6 are arranged in this order from the negative X-axis side toward the positive X-axis side.

The carry-in/out station 2 is equipped with a plurality of placing members 21. These placing members 21 are arranged side by side in the Y-axis direction. A cassette CS is placed on each of the placing members 21. The cassette CS accommodates therein a plurality of combined substrates 150 at an interval therebetween in a vertical direction. Here, the number of the placing members 21 is not particularly limited. Likewise, the number of the cassettes CS is not particularly limited, either.

Moreover, the carry-in/out station 2 is equipped with a transfer section 23. The transfer section 23 is disposed next to the placing members 21, for example, on the positive X-axis side of the placing members 21. Also, the transfer section 23 is positioned next to a delivery section 26, for example, on the negative X-axis side of the delivery section 26. The transfer section 23 is equipped with a transfer device 24 inside.

The transfer device 24 is equipped with a holder configured to hold the combined substrate 150. The holder is configured to be movable in horizontal directions (both in the X-axis direction and the Y-axis direction) and a vertical direction and pivotable around a vertical axis.

The transfer device 24 is configured to transfer the combined substrates 150 between the plurality of cassettes CS placed on the plurality of placing members 21 and the delivery section 26.

Further, the carry-in/out station 2 is equipped with the delivery section 26. The delivery section 26 is disposed next to the transfer section 23, for example, on the positive X-axis side of the transfer section 23. Also, the delivery section 26 is positioned next to the first processing station 3, for example, on the negative X-axis side of the first processing station 3. The delivery section 26 has a transition device 27. The transition device 27 temporarily accommodates therein the combined substrate 150. A plurality of transition devices 27 may be stacked in the vertical direction. The layout and the number of the transition devices 27 are not particularly limited.

Figure 4A:
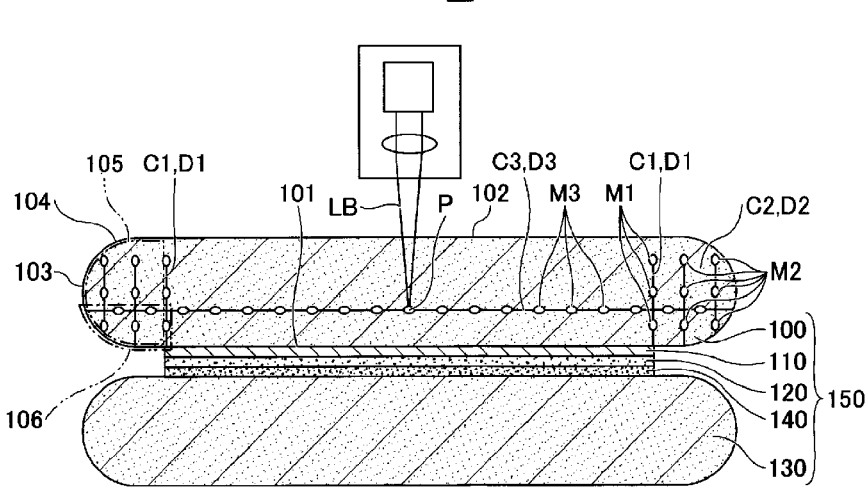
FIG. 4A is a cross sectional view illustrating an example of a laser processing shown in FIG. 3.

The first processing station 3 is equipped with a processing block 4. The processing block 4 includes a laser processing apparatus 41, a cleaning apparatus 42, and an etching apparatus 43. As shown in FIG. 4A, the laser processing apparatus 41 is configured to form condensing points P of a laser beam LB in the processing target substrate 100, and form a first modification layer M1, a second modification layer M2, and a third modification layer M3 at the condensing points P. The cleaning apparatus 42 is configured to clean the second main surface 102 of the thinned processing target substrate 100. The etching apparatus 43 is configured to etch the second main surface 102 of the thinned processing target substrate 100. Here, the layout and the number of the various apparatuses constituting the processing block 4 are not limited to the layout and the number shown in FIG. 1.

The first processing station 3 is equipped with a transfer section 5. The transfer section 5 is provided next to the transition device 27 of the carry-in/out station 2, for example, on the positive X-axis side of the transition device 27. Further, the transfer section 5 is positioned next to the processing block 4, for example, on the positive Y-axis side of the processing block 4. Also, the transfer section 5 is disposed next to the second processing station 6, for example, on the negative X-axis side of the second processing station 6. The transfer section 5 is equipped with a first transfer device 51 inside.

The first transfer device 51 is equipped with a holder configured to hold the combined substrate 150. The holder is configured to be movable in the horizontal directions (both in the X-axis direction and the Y-axis direction) and a vertical direction and pivotable around a vertical axis. The first transfer device 51 transfers the combined substrate 150 to/from the transition device 27 of the carry-in/out station 2, the processing block 4 of the first processing station 3, and a bevel removing apparatus 61 of the second processing station 6.

Figure 5:
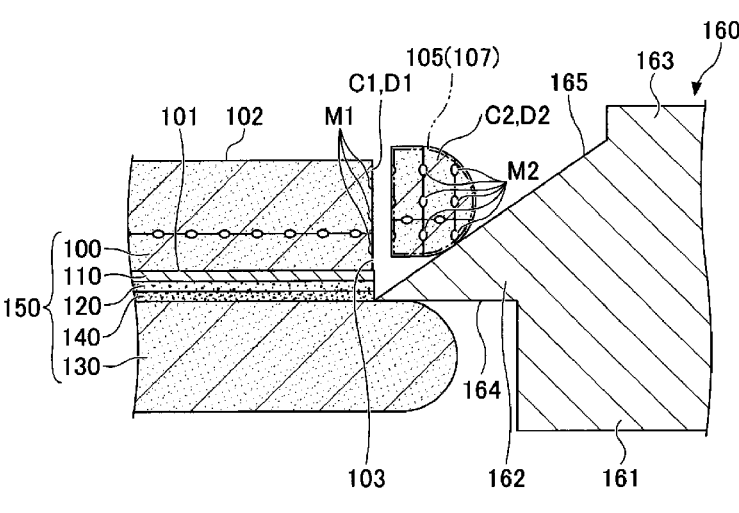
FIG. 5 is a cross sectional view illustrating an example of bevel removing shown in FIG. 3.
Figure 6:
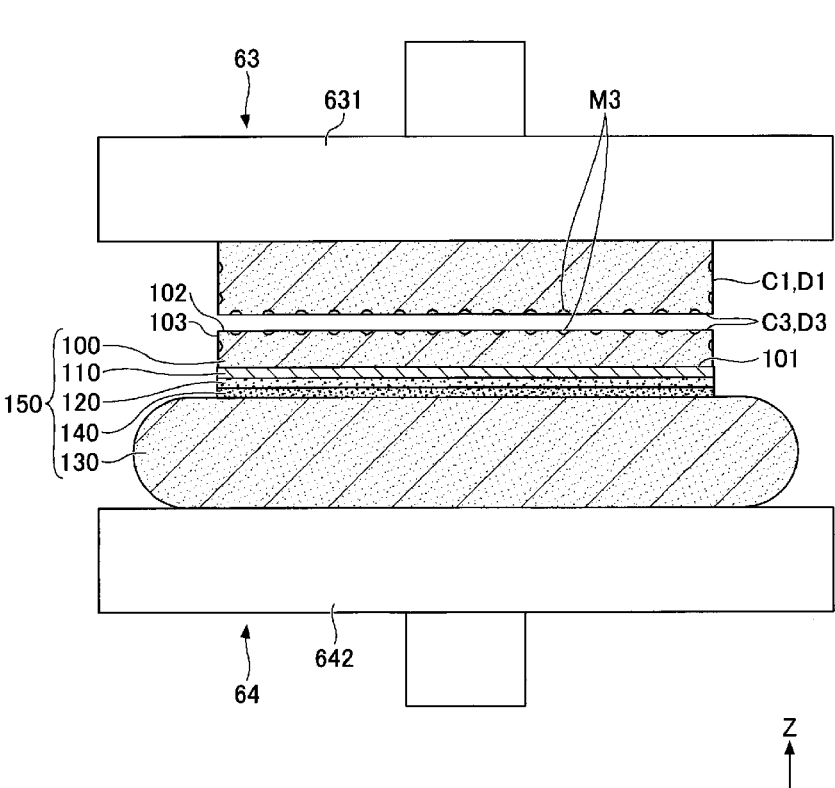
FIG. 6 is a cross sectional view illustrating an example of thinning shown in FIG. 3.

The second processing station 6 has the bevel removing apparatus 61 and a thinning apparatus 62. As illustrated in FIG. 5, the bevel removing apparatus 61 is configured to remove the bevel 104 of the processing target substrate 100 by applying an external force to the processing target substrate 100 to extend a first crack C1 formed starting from the first modification layer M1 and a second crack C2 formed starting from the second modification layer M2. As shown in FIG. 6, the thinning apparatus 62 is configured to thin the processing target substrate 100 by applying an external force to the processing target substrate 100 to extend a third crack C3 formed starting from the third modification layer M3. The thinning apparatus 62 is equipped with, for example, a second transfer device 63 and a grinding apparatus 64. The second transfer device 63 is configured to transfer the combined substrate 150 from the bevel removing apparatus 61 to the grinding apparatus 64. The grinding apparatus 64 is configured to grind the second main surface 102 of the thinned processing target substrate 100, and thus further is configured to thin the processing target substrate 100. The thinned processing target substrate 100 is transferred into the cleaning apparatus 42 by the second transfer device 63. Here, the layout and the number of the various apparatuses in the second processing station 6 are not limited to the layout and the number shown in FIG.

1. For example, the thinning apparatus 62 may be provided separately from the second transfer device 63.

The control device 9 is, for example, a computer, and includes a CPU (Central Processing Unit) 91 and a recording medium 92 such as a memory, as shown in FIG. 1. The recording medium 92 stores therein a program for controlling various kinds of processings performed in the thinning system 1. The control device 9 controls an operation of the thinning system 1 by allowing the CPU 91 to execute the program stored in the recording medium 92. Further, the control device 9 includes an input interface 93 and an output interface 94. The control device 9 receives a signal from the outside through the input interface 93, and transmits a signal to the outside through the output interface 94.

The program is stored in, for example, a computer-readable recording medium, and installed from this recording medium to the recording medium 92 of the control device 9. The computer-readable recording medium may be, by way of non-limiting example, a hard disk (HD), a flexible disk (FD), a compact disk (CD), a magnet optical disk (MO), a memory card, or the like. Further, the program may be downloaded from a server through the Internet and installed to the recording medium 92 of the control device 9.

Figure 3:
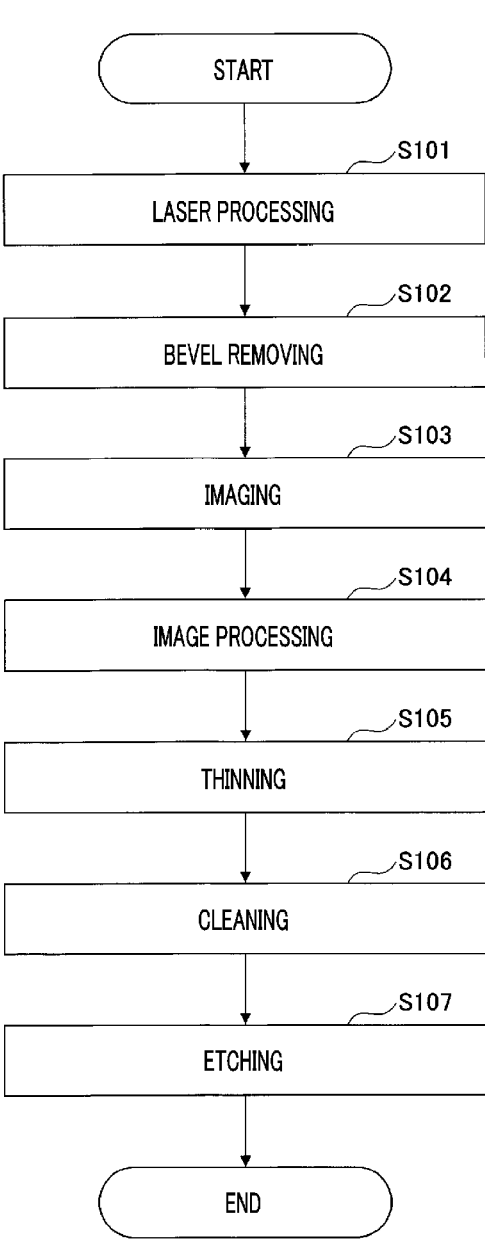
FIG. 3 is a flowchart illustrating a thinning method according to the exemplary embodiment.

FIG. 3 is a flowchart illustrating a thinning method according to the exemplary embodiment. The thinning method includes, for example, processes S101 to S107 shown in FIG. 3. These processes S101 to S107 are performed under the control of the control device 9.

First, the transfer device 24 takes out the combined substrate 150 from the cassette CS placed on the placing member 21, and transfers it into the transition device 27. Then, the first transfer device 51 receives the combined substrate 150 from the transition device 27 and transfers it into the laser processing apparatus 41.

Thereafter, the laser processing apparatus 41 laser-processes the processing target substrate 100 (S101 of FIG. 3). As shown in FIG. 4A, the laser processing apparatus 41 forms the condensing points P of the laser beam LB inside the processing target substrate 100 from the opposite side (e.g., the upper side) to the device layer 110 with the processing target substrate 100 therebetween, and forms the modification layers at the condensing points P. The laser beam LB is pulse-oscillated, and the modification layers are formed at an interval therebetween.

When the processing target substrate 100 is single crystal silicon, an infrared ray is used as the laser beam LB. The Infrared ray has high transmittivity for the single crystal silicon, and an amorphous silicon layer is formed at a condensing point P of the infrared ray as a modification layer. The modification layer serves as a starting point for dividing the processing target substrate 100. The division of the processing target substrate 100 is carried out by applying a stress.

Figure 4B:
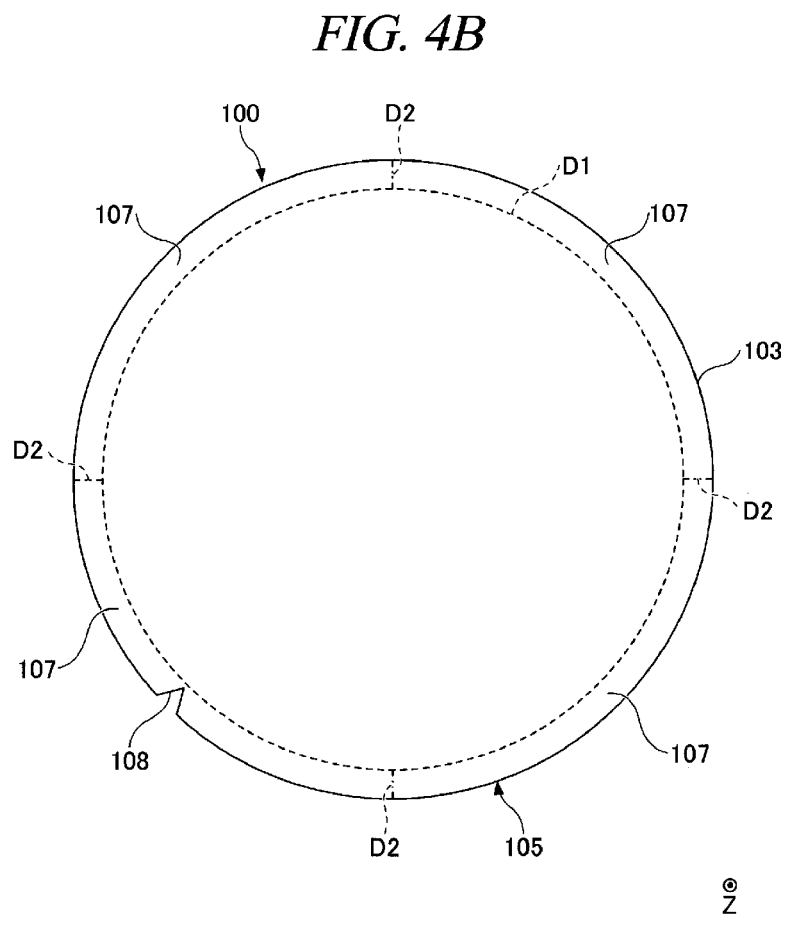

FIG. 4A is a cross sectional view showing an example of the laser processing shown in FIG. 3. FIG. 4B is a plan view illustrating positions of a first division surface and a second division surface shown in FIG. 4A.

In the laser processing apparatus 41, the first modification layer M1 is formed on a first division surface D1 that divides the processing target substrate 100 in a diametrical direction thereof. The first division surface D1 is a circumferential surface concentric with an outer periphery 103 of the processing target substrate 100 as shown in FIG. 4B. As shown in FIG. 4A, the first modification layer M1 is plural in number, and these multiple first modification layers M1 are formed at intervals therebetween in the circumferential direction and the thickness direction of the processing target substrate 100. When the first modification layers M1 are formed, the first crack C1 connecting the first modification layers M1 is formed. The first crack C1 may be formed so as to reach the first main surface 101 and not to reach the second main surface 102.

The first division surface D1 is positioned at an inner side than the bevel 104 of the processing target substrate 100 in the diametrical direction. The bevel 104 can be removed by removing a peripheral portion 105 at an outer side than the first division surface D1 in the diametrical direction. The processing target substrate 100 may be thinned after the bevel 104 is removed, so that generation of a so-called knife edge 106 can be suppressed.

Further, as shown in FIG. 4B, the laser processing apparatus 41 forms the second modification layer M2 on a plurality of second division surfaces D2 extending radially from the first division surface D1 to the outer periphery 103 of the processing target substrate 100. The second modification layer M2 is plural in number, and these multiple second modification layers M2 are formed at intervals therebetween in the diametrical direction and the thickness direction of the processing target substrate 100, as illustrated in FIG. 4A. When the second modification layers M2 are formed, the second crack C2 connecting the second modification layers M2 is formed. Although the number of the second division surfaces D2 is four in FIG. 4B, it is not particularly limited as long as more than one second division surface D2 is provided. If the number of the second division surfaces D2 is more than one, the ring-shaped peripheral portion 105 can be removed by being divided into multiple arc-shaped fragments 107.

Moreover, the laser processing apparatus 41 forms the third modification layer M3 on a third division surface D3 that divides the processing target substrate 100 in the thickness direction thereof, as shown in FIG. 4A. The third division surface D3 is a flat surface parallel to the first main surface 101 and the second main surface 102 of the processing target substrate 100. The third modification layers M3 is plural in number, and these multiple third modification layers M3 are formed at intervals therebetween in the circumferential direction and the diametrical direction of the processing target substrate 100, and are arranged concentrically. Alternatively, the third modification layers M3 may be arranged in a spiral shape. When the third modification layers M3 are formed, the third crack C3 connecting the third modification layers M3 is formed.

The order of the formation of the first modification layers M1, the second modification layers M2, and the third modification layers M3 is not particularly limited. After the formation of the first modification layers M1, the second modification layers M2 and the third modification layers M3, the first transfer device 51 receives the combined substrate 150 from the laser processing apparatus 41, and transfers it to the bevel removing apparatus 61.

FIG. 5 is a cross sectional view illustrating an example of bevel removing shown in FIG. 3. As shown in FIG. 5, the bevel removing apparatus 61 applies an external force to the processing target substrate 100 with a blade 160 used as a processing tool. The blade 160 is inserted between the processing target substrate 100 and the support substrate 130, and it does not cut the processing target substrate 100. By inserting the blade 160, the first crack C1 starting from the first modification layer M1 and the second crack C2 starting from the second modification layer M2 are extended to thereby remove the bevel 104 of the processing target substrate 100 (S102 of FIG. 3). As the bevel 104 is removed, the processing target substrate 100 is reduced in size in the diametrical direction. The outer periphery 103 of the processing target substrate 100 reduced in size in the diametrical direction coincides with the first division surface D1. Here, although the blade 160 is used as the processing tool in the present exemplary embodiment, a roller may be used instead of the blade. In the present exemplary embodiment, the processing tool is pressed against the outer periphery of the processing target substrate 100 from a lateral side of the processing target substrate 100. However, the processing tool may be pressed against the outer periphery of the processing target substrate 100 from above the processing target substrate 100.

Subsequently, the bevel removing apparatus 61 images the outer periphery 103 of the processing target substrate 100 (S103 of FIG. 3), and image-processes the captured image (S104 of FIG. 3). Through this image processing, the removal of the bevel 104 can be confirmed. Also, by this image processing, it can be confirmed whether the third crack C3 has reached the outer periphery 103 of the processing target substrate 100, that is, the first division surface D1. Then, the second transfer device 63 receives the combined substrate 150 from the bevel removing apparatus 61, and transfers it to the grinding apparatus 64.

The grinding apparatus 64 includes, for example, a rotary table 641, two chucks 642, and a processing unit 643, as depicted in FIG. 1. The number and the layout of the chucks 642 are not particularly limited. Further, the number and the layout of the processing unit 643 are not particularly limited, either.

The rotary table 641 is rotated about a vertical rotation center line Z1. The two chucks 642 are disposed with the rotation center line Z1 of the rotary table 641 therebetween. The two chucks 642 are rotated along with the rotary table 641 and moved to a carry-in/out position AO and a grinding position A1 alternately.

The carry-in/out position AO serves as a carry-in position where the combined substrate 150 is carried in by the second transfer device 63 and a carry-out position where the combined substrate 150 is carried out by the second transfer device 63. Meanwhile, the grinding position A1 is a position where grinding of the processing target substrate 100 is performed by the processing unit 643.

FIG. 6 is a cross sectional view illustrating an example of thinning shown in FIG. 3. At the carry-in/out position AO, the grinding apparatus 64 and the second transfer device 63 divide the processing target substrate 100 along the third division surface D3, as shown in FIG. 6, so that the processing target substrate 100 is thinned (S105 of FIG. 3). The thinning apparatus 62 includes the second transfer device 63 and the grinding apparatus 64 as stated above.

In the state that the processing target substrate 100 is held by the second transfer device 63 from above and held by the grinding apparatus 64 from below, a holder 631 of the second transfer device 63 is raised with respect to the chuck 642 of the grinding apparatus 64. As a result, the third crack C3 expands in a planar shape, and adjacent third cracks C3 are connected to each other, so that the processing target substrate 100 is divided along the third division surface D3.

The holder 631 of the second transfer device 63 may be raised while being rotated around a vertical rotation axis in order to cut the processing target substrate 100 along the third division surface D3. Instead of the holder 631 of the second transfer device 63, the chuck 642 of the grinding apparatus 64 may be rotated. In addition, both the holder 631 of the second transfer device 63 and the chuck 642 of the grinding apparatus 64 may be rotated in opposite directions.

The device layer 110 is formed on the first main surface 101 of the processing target substrate 100 divided along the third division surface D3. Further, irregularities generated when the third cracks C3 are connected are formed on the second main surface 102 of the processing target substrate 100 divided along the third division surface D3.

Next, the grinding apparatus 64 grinds the second main surface 102 of the processing target substrate 100. The grinding is a part of the thinning. The second main surface 102 of the processing target substrate 100 is planarized by the grinding. A plate thickness of the processing target substrate 100 after being ground is set to a required value in consideration of the usage of the processing target substrate 100 or the like. A variation amount in the plate thickness of the processing target substrate 100 before and after the grinding, that is, a grinding allowance is set so that the third modification layers M3 are removed by the grinding. Then, the second transfer device 63 receives the combined substrate 150 from the grinding apparatus 64, and transfers it to the cleaning apparatus 42.

Subsequently, the cleaning apparatus 42 cleans the second main surface 102 of the thinned processing target substrate 100 (S106 of FIG. 3). The cleaning may be, for example, scrub-cleaning. By cleaning the second main surface 102, it is possible to remove particles or the like generated in the thinning. Thereafter, the first transfer device 51 receives the combined substrate 150 from the cleaning apparatus 42, and transfers it to the etching apparatus 43.

Next, the etching apparatus 43 etches the second main surface 102 of the thinned processing target substrate 100 (S107 of FIG. 3). The etching is, for example, wet etching. By etching the second main surface 102, a damage layer caused by the thinning can be removed.

Thereafter, the first transfer device 51 receives the combined substrate 150 from the etching apparatus 43, and transfers it to the transition device 27. Then, the transfer device 24 receives the combined substrate 150 from the transition device 27, and transfers it to the cassette CS disposed on the placing member 21. Then, the current processing is ended.

Here, the order of the above-stated processes S101 to S107 is not limited to the example shown in FIG. 3. By way of example, the formation of the first modification layer M1 and the second modification layer M2, the division along the first division surface D1 and the second division surface D2, the formation of the third modification layer M3, and the division along the third division surface D3 may be performed in this sequence. In addition, the grinding may be performed without performing the formation of the third modification layer M3 and the division along the third division surface D3. That is, the thinning may be carried out only by the grinding. Furthermore, the thinning may include only the division along the third division surface D3 without including the grinding.

Figure 7:
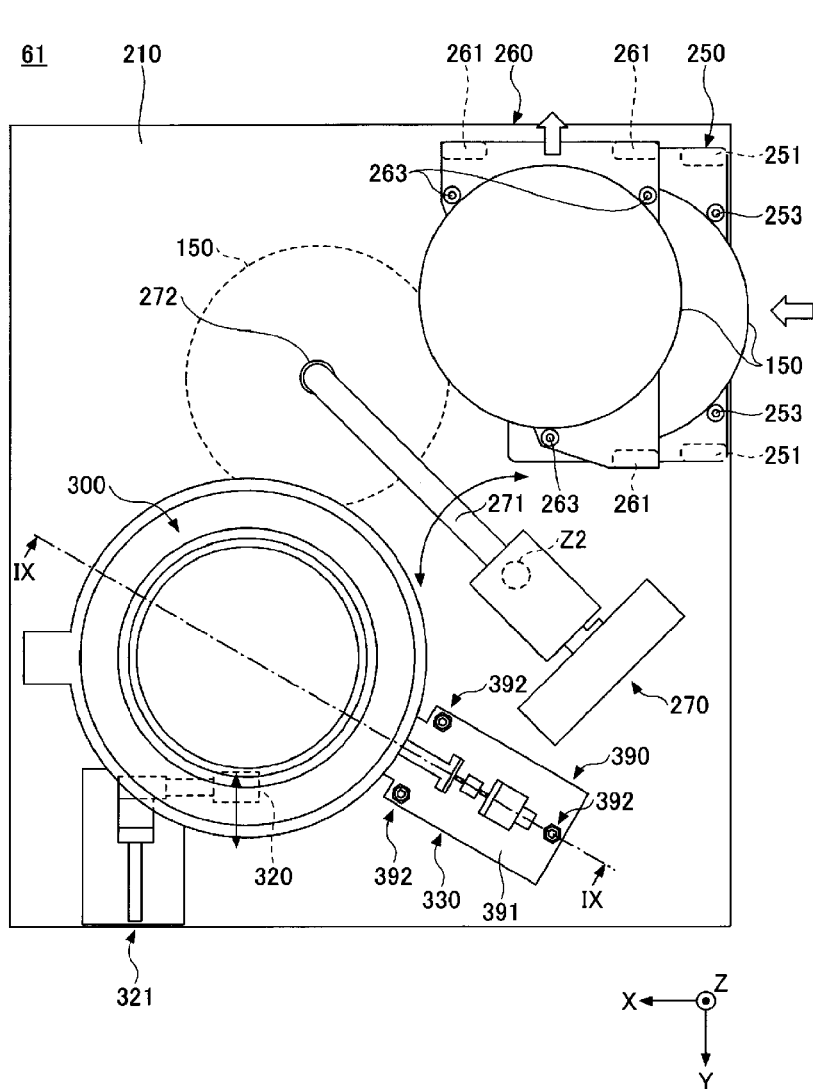
FIG. 7 is a plan view illustrating a bevel removing apparatus according to the exemplary embodiment.
Figure 8:
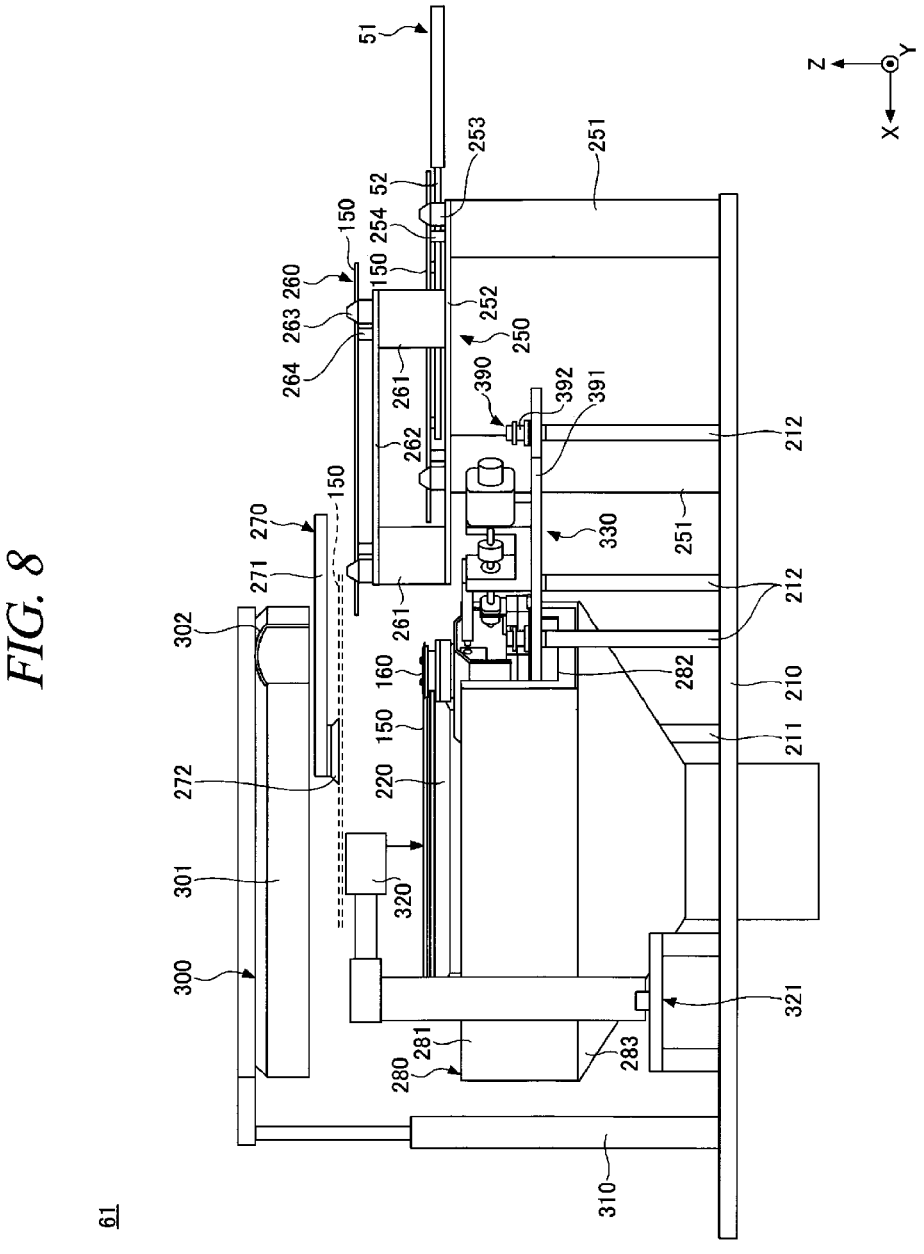
FIG. 8 is a diagram showing the bevel removing apparatus of FIG. 7 seen from the positive Y-axis side.
Figure 9A:
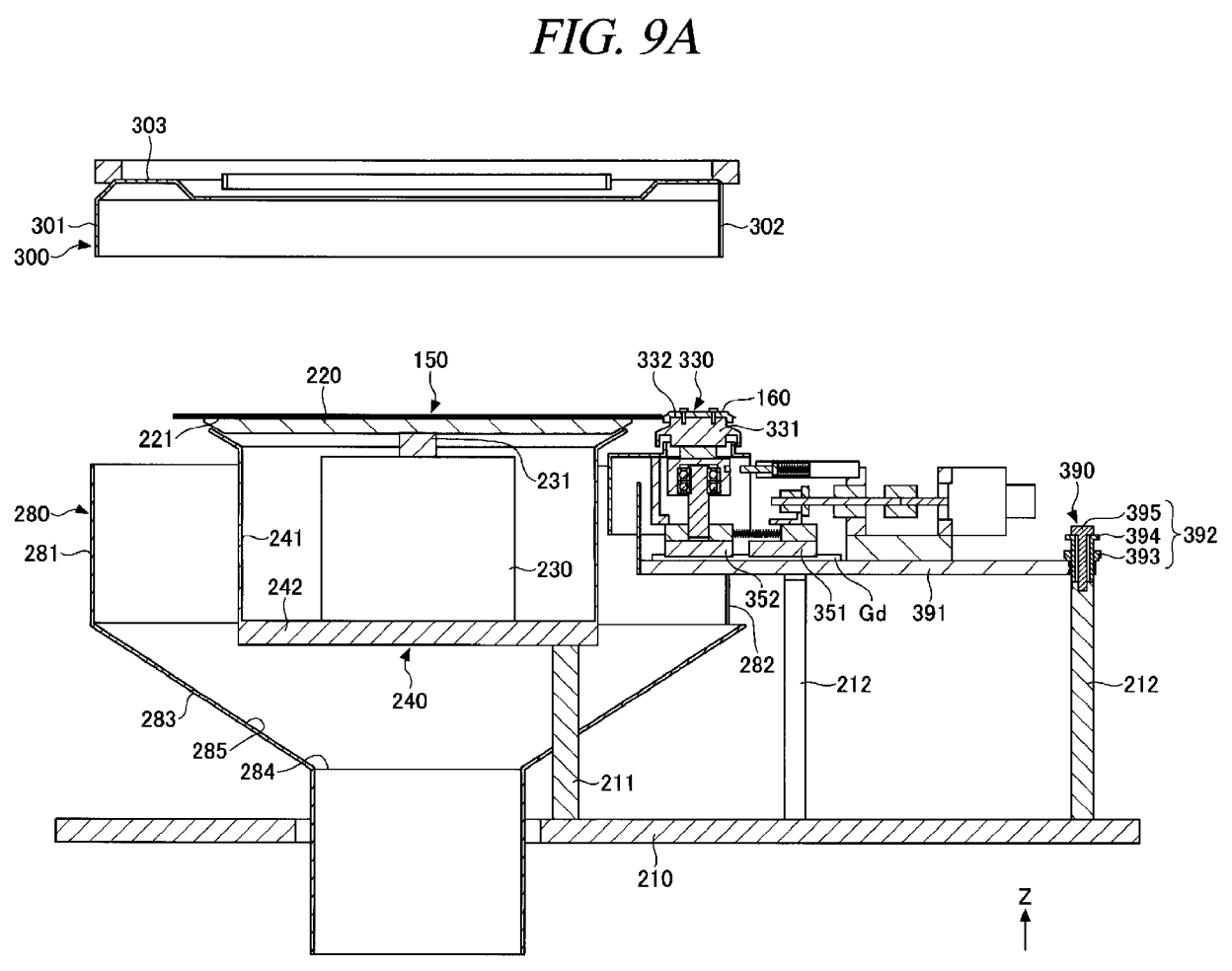
Figure 9B:
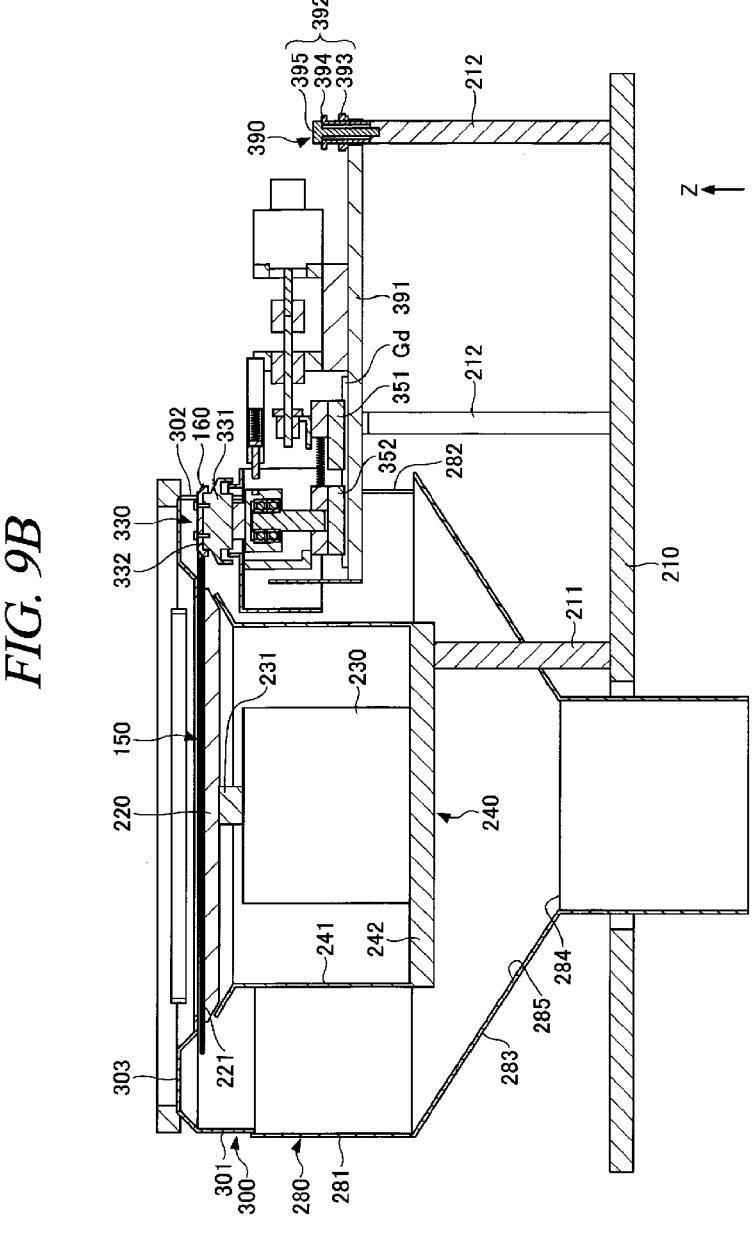
FIG. 9B is a cross sectional view taken along the line IX-IX of FIG. 7, showing a closing position of the upper cover.

FIG. 7 is a plan view showing the bevel removing apparatus according to the exemplary embodiment. In FIG. 7, white arrows indicate a carrying-in direction and a carrying-out direction of the combined substrate 150. The carrying-in direction and the carrying-out direction are, for example, directions perpendicular to each other. FIG. 8 illustrates the bevel removing apparatus of FIG. 7 seen from the positive Y-axis side. FIG. 9A is a cross sectional view taken along a line IX-IX of FIG. 7, showing an opening position of an upper cover, and FIG. 9B is a cross sectional view taken along the line IX-IX of FIG. 7, showing a closing position of the upper cover.

The bevel removing apparatus 61, which is a substrate processing apparatus, removes the bevel 104 of the processing target substrate 100 by pressing the horizontal blade 160 against an outer periphery of the combined substrate 150, as illustrated in FIG. 5. The blade 160 is inserted between the processing target substrate 100 and the support substrate 130. Hereinafter, the processing by the blade 160 will be simply referred to as "processing." The bevel removing apparatus 61 includes a base 210, a chuck 220, a rotating mechanism 230, a protective cup 240, the first storage table 250, the second storage table 260, and the internal transfer mechanism 270, as illustrated in FIG. 7, FIG. 8, FIG. 9A and FIG. 9B.

As shown in FIG. 9A and FIG. 9B, the base 210 is, for example, a horizontal board, and it supports the protective cup 240 with at least one supporting column 211 therebetween. The protective cup 240 has a cylindrical member 241 having a vertical cylindrical shape; and a lid 242 that closes an opening at a lower end of the cylindrical member 241. The protective cup 240 accommodates a rotating mechanism 230 inside the cylindrical member 241, protecting the rotating mechanism 230 from processing residues. The rotating mechanism 230 rotates the chuck 220 about a vertical rotation shaft 231.

Figure 11:
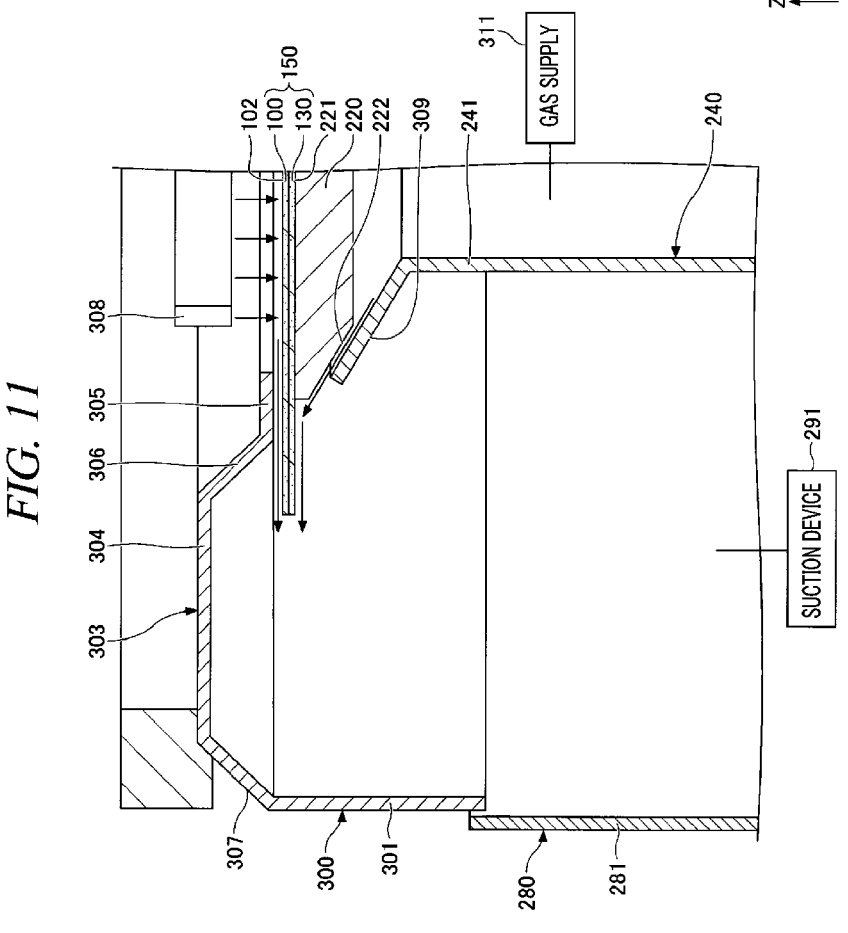
FIG. 11 is a cross sectional view illustrating an example of a gas flow formed around an outer periphery of a combined substrate when a processing is performed.

The chuck 220 holds the processing target substrate 100 horizontally from below with the second main surface 102 of the processing target substrate 100 facing upwards, as shown in FIG. 11. The chuck 220 holds the processing target substrate 100 with the support substrate 130 therebetween. The chuck 220 is, for example, a vacuum chuck, but it may be an electrostatic chuck, a mechanical chuck, or the like. The processing target substrate 100 is processed while being held by the chuck 220.

As shown in FIG. 8, the first storage table 250 receives and stores the combined substrate 150 before being processed carried from the outside by the first transfer device 51. The first storage table 250 includes a plurality of first supporting columns 251 fixed to the base 210; and a first horizontal plate 252 supported horizontally by the plurality of first supporting columns 251. A difference in height between a position where the combined substrate 150 is stored on the first storage table 250 and a position where the combined substrate 150 is held on the chuck 220 can be reduced by the first supporting columns 251. As a result, when transferring the combined substrate 150 with the internal transfer mechanism 270, an elevating operation can be reduced.

The first storage table 250 has three or more first guide pins 253 for performing a center alignment of the combined substrate 150. The three or more first guide pins 253 are spaced apart from each other in the circumferential direction of the combined substrate 150, and each has a tapered surface that narrows whet it goes upwards. The center alignment of the combined substrate 150 is performed by these tapered surfaces.

The first storage table 250 has three or more first supporting pins 254 for supporting the combined substrate 150. The three or more first supporting pins 254 support combined substrate 150 whose center alignment is performed by the three or more first guide pins 253 such that the combined substrate 150 is lifted from the first horizontal plate 252 so as not to be in contact with the first horizontal plate 252. A gap is formed between the first horizontal plate 252 and the combined substrate 150. Further, the first storage table 250 may have one first support member for supporting a central portion of the combined substrate 150 instead of the three or more first supporting pins 254.

The first transfer device 51 has a holder 52 configured to hold the combined substrate 150. The holder 52 is formed to have, for example, a bifurcated fork shape, and holds the combined substrate 150 horizontally from below with the second main surface 102 of the processing target substrate 100 facing upwards. After placing the combined substrate 150 on the first storage table 250, the holder 52 releases attraction of the combined substrate 150. Then, the holder 52 is lowered slightly and taken out from the gap formed between the combined substrate 150 and the first horizontal plate 252.

In addition, although the first supporting pins 254 do not attract the combined substrate 150 in the present exemplary embodiment, they may be configured to attract the combined substrate 150. That is, the first supporting pins 254 may serve as an attracting unit configured to attract the combined substrate 150. Since the first supporting pins 254 can start attracting the combined substrate 150 before the first transfer device 51 releases the attraction of the combined substrate 150, position deviation of the combined substrate 150 can be suppressed when the combined substrate 150 is transferred. Thus, as compared to the case where the first guide pins 253 are used, accuracy of the center alignment of the combined substrate 150 can be improved. The first support member, instead of the first supporting pins 254, may be configured as the attracting unit.

The second storage table 260 stores the combined substrate 150 after being processed until the processed combined substrate 150 is taken out to the outside by the second transfer device 63. As shown in FIG. 8, the second storage table 260 includes a plurality of second supporting columns 261 fixed to the first horizontal plate 252 of the first storage table 250; and a second horizontal plate 262 supported horizontally by the second supporting columns 261. Since the first storage table 250 and the second storage table 260 are stacked in the vertical direction, the bevel removing apparatus 61 can be downsized when viewed in the vertical direction. Further, the arrangement of the first storage table 250 and the second storage table 260 may be reversed, so the first storage table 250 may be disposed on top of the second storage table 260.

The second storage table 260 has three or more second guide pins 263 for performing center alignment of the combined substrate 150. The three or more second guide pins 263 are spaced apart from each other in the circumferential direction of the combined substrate 150, and each has a tapered surface that narrows when it goes upwards. The center alignment of the combined substrate 150 is performed by these tapered surfaces.

The second storage table 260 has three or more second supporting pins 264 for supporting the combined substrate 150. The three or more second supporting pins 264 support the combined substrate 150 whose center alignment is performed by the three or more second guide pins 263 such that the combined substrate 150 is lifted from the second horizontal plate 262 so as not to be in contact with the second horizontal plate 262. A gap is formed between the second horizontal plate 262 and the combined substrate 150. Here, the second storage table 260 may have one second support member for supporting the central portion of the combined substrate 150 instead of the three or more second supporting pins 264.

As shown in FIG. 6, the second transfer device 63 includes the holder 631 configured to hold the combined substrate 150 horizontally. The holder 631 is formed in, for example, a disk shape, and attracts the entire top surface of the combined substrate 150 from above. The holder 631 receives the combined substrate 150 from the second storage table 260, rises with the combined substrate 150 attracted thereto, and moves to the outside of the bevel removing apparatus 61.

In addition, as mentioned above, when the thinning apparatus 62 is provided separately from the second transfer device 63, the holder 631 of the second transfer device 63 may be formed to have a bifurcated fork shape, like the holder 52 of the first transfer device 51, and may be configured to hold the combined substrate 150 horizontally from below with the second main surface 102 of the processing target substrate 100 facing upwards. In this case, after being inserted into the gap formed between the combined substrate 150 and the second horizontal plate 262, the holder 631 rises and receives the combined substrate 150 from the second storage table 260.

Additionally, although the second supporting pins 264 do not attract the combined substrate 150 in the present exemplary embodiment, they may be configured to attract the combined substrate 150. That is, the second supporting pins 264 may serve as an attracting unit configured to attract the combined substrate 150. Since the second supporting pins 264 can start the attraction of the combined substrate 150 before the second transfer device 63 releases the attraction of the combined substrate 150, the position deviation of the combined substrate 150 can be suppressed when the combined substrate 150 is transferred. Thus, as compared to the case where the second guide pins 263 are used, the accuracy of the center alignment of the combined substrate 150 can be improved. Here, the second support member, instead of the second supporting pins 264, may be configured as the attracting unit.

The internal transfer mechanism 270 serves to transfer the combined substrate 150 before being processed from the first storage table 250 to the chuck 220, and also serves to transfer the combined substrate 150 after being processed from the chuck 220 to the second storage table 260. Since the internal transfer mechanism 270 carries the combined substrate 150 to/from the chuck 220, there is no such restriction that the chuck 220 needs to be installed in a range accessible by the first transfer device 51 and the second transfer device 63. Therefore, the degree of freedom in selecting the installation position of the chuck 220 is high.

As shown in FIG. 7, the internal transfer mechanism 270 includes, for example, a revolving arm 271 configured to be revolved about a revolving axis Z2; and a holder 272 mounted to a leading end of the revolving arm 271. The revolving arm 271 and the holder 272 are can be revolved and, also, movable up and down.

The holder 272 is configured to hold the combined substrate 150 horizontally from above with the second main surface 102 of the processing target substrate 100 facing upwards. Since the holder 272 and the chuck 220 hold the combined substrate 150 from the opposite sides, one can attract the combined substrate 150 while the other already attracts the combined substrate 150. Thus, it is possible to reduce the position deviation of the combined substrate 150 when the combined substrate 150 is transferred.

In order to scale down the holder 272 such that the holder 272 does not touch the second supporting columns 261 of the second storage table 260 or the like when it is revolved, the holder 272 may be configured not to attract the entire top surface of the combined substrate 150 but to attract, for example, the center of the combined substrate 150. The holder 272 is formed to have, for example, a disk shape, and has a diameter smaller than the diameter of the combined substrate 150, for example. Moreover, the first supporting columns 251 and the second supporting columns 261 are arranged at positions where they do not interfere with the revolving of the revolving arm 271 and the holder 272.

According to the present exemplary embodiment, since the first storage table 250 and the second storage table 260 are separately provided, multiple combined substrates 150 can be accommodated in the bevel removing apparatus 61. Thus, a combined substrate 150 before being processed can be carried in before a combined substrate 150 after being processed is completely carried out. That is, since the combined substrate 150 before being processed can always be prepared in the bevel removing apparatus 61, the number of the combined substrates processed per unit time can be increased.

Also, according to the present exemplary embodiment, since the first storage table 250 and the second storage table 260 are provided separately, carrying the combined substrate 150 before being processed onto the first storage table 250 from the outside and carrying the combined substrate 150 after being processed from the second storage table 260 to the outside can be performed at the same time. At this time, the first storage table 250 receives the combined substrate 150 before being processed from the first transfer device 51, and the second storage table 260 hands the combined substrate 150 after being processed over to the second transfer device 63. Since the plurality of processes can be performed simultaneously, the number of the combined substrates processed per unit time can be improved.

Furthermore, according to the present exemplary embodiment, since the chuck 220, the first storage table 250, and the second storage table 260 are separately provided, the following processes (1) and (2) can be also performed. (1) Carrying the combined substrate 150 before being processed from the outside onto the first storage table 250 and transferring the combined substrate 150 after being processed from the chuck 220 onto the second storage table 260 are performed simultaneously. (2) Transferring the combined substrate 150 before being processed from the first storage table 250 onto the chuck 220 and carrying the combined substrate 150 after being processed from the second storage table 260 to the outside are performed simultaneously.

As depicted in FIG. 9A and FIG. 9B, the bevel removing apparatus 61 includes a lower cup 280, and the lower cup 280 collects the processing residues falling from the combined substrate 150 over the entire circumference of the combined substrate 150. The processing residues are generated due to the processing using the blade 160, and includes, for example, at least one of the fragments 107 and dust. Since the combined substrate 150 is rotated along with the chuck 220 during the processing, the processing residues may fall at various rotation angles. Since the lower cup 280 collects the processing residues falling from the combined substrate 150 over the entire circumference of the combined substrate 150 as mentioned above, the processing residues can be collected reliably, so that the bevel removing apparatus 61 and the combined substrate 150 can be maintained clean.

The lower cup 280 has a lower cylindrical member 281 which is larger than the combined substrate 150 when viewed from above. The lower cylindrical member 281 is formed in a cylindrical shape so as to surround the combined substrate 150 held by the chuck 220, when viewed from above. The lower cylindrical member 281 may have a groove 282 to avoid interference between the lower cylindrical member 281 and a processing unit 330. As the lower cylindrical member 281 can be given a small diameter, the lower cup 280 can be downsized. The lower cylindrical member 281 may be disposed below the combined substrate 150 in order to avoid interference with the revolving arm 271 and the holder 272.

The lower cup 280 has a lower lid 283 that closes an opening at a lower end of the lower cylindrical member 281. The lower lid 283 is provided with a discharge opening 284 for discharging the processing residues. Since the discharge opening 284 is formed, deposition of the processing residues inside the lower cup 280 can be suppressed. The lower lid 283 has the discharge opening 284 in the center thereof, and has, over the entire circumference of the lower cylindrical member 281, an inclined surface 285 that slopes downwards as it goes from the lower cylindrical member 281 toward the discharge opening 284. The inclined surface 285 is formed in, for example, a conical shape. As compared to a case where the discharge opening 284 is provided at one end of the lower lid 283, it is possible to form the inclined surface 285 with the same height difference and a steep inclination, thus allowing the processing residues to fall down easily. Alternatively, as compared to the case where the discharge opening 284 is provided at one end of the lower lid 283, it is possible to form the inclined surface 285 having the same inclination and a small height difference, so that a size of the lower lid 283 in the vertical direction can be reduced.

Figure 10:
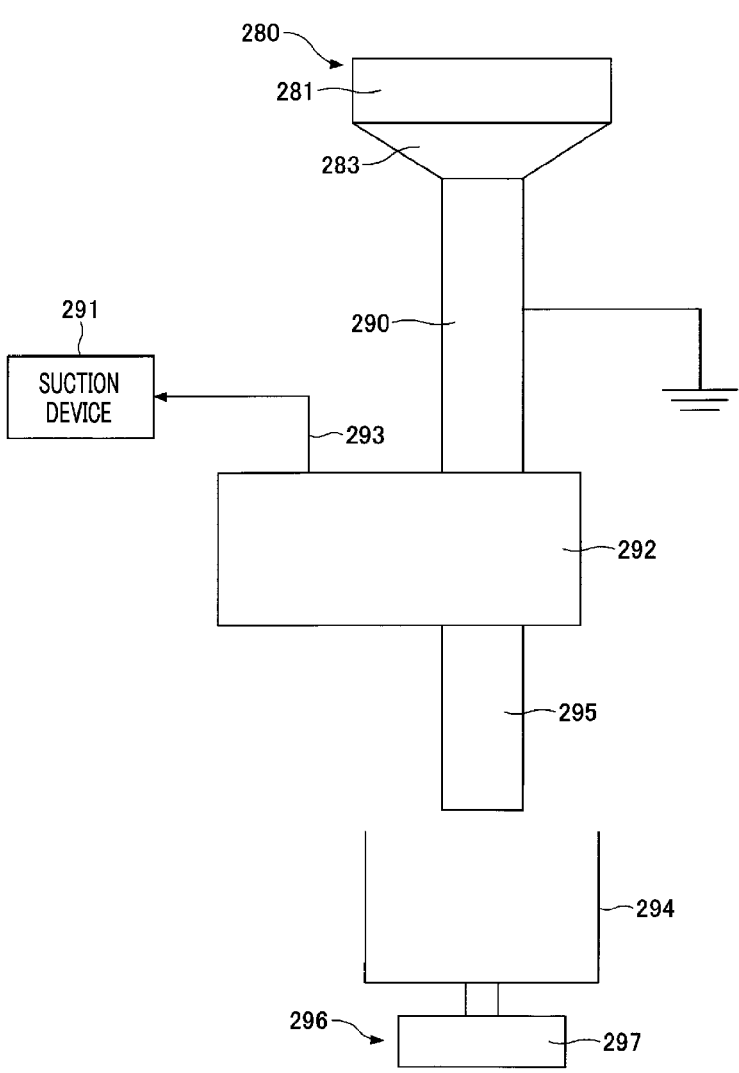
FIG. 10 is a side view illustrating a lower cup and a discharge pipe.

FIG. 10 is a side view illustrating an example of the lower cup and a discharge pipe. The lower cup 280 is formed of a conductive material such as a metal, formed of an insulating material and coated with an anti-static agent, or formed of a mixture of an insulating material and an anti-static agent. The anti-static agent is a chemical agent which suppresses accumulation of static electricity by an action of a surfactant, for example, and it adsorbs moisture in the air into a surface of the insulating material to reduce electrical resistance. Since the lower cup 280 can be suppressed from being electrically charged, adhesion of the processing residues to the lower cup 280 that might be caused by the static electricity can be suppressed, and, thus, deposition of the processing residues in the lower cup 280 can be suppressed. In order to suppress electrically charging of the lower cup 280 securely, the lower cup 280 may be grounded, as shown in FIG. 10, for example.

The bevel removing apparatus 61 includes a discharge pipe 290, and the discharge pipe 290 guides the processing residues falling from the discharge opening 284 of the lower cup 280 downwards. Using the discharge pipe 290, it is possible to guide the processing residues to a required position. The discharge pipe 290, like the lower cup 280, is formed of a conductive material, formed of an insulating material and coated with an anti-static agent, or formed of a mixture of an insulating material and an anti-static agent. Since the discharge pipe 290 can be suppressed from being electrically charged, adhesion of the processing residues to the discharge pipe 290 due to static electricity can be suppressed, and, therefore, it is possible to suppress accumulation of the processing residues inside the discharge pipe 290. In order to suppress electrically charging of the discharge pipe 290 securely, the discharge pipe 290 may be grounded, as shown in FIG. 10, for example.

The bevel removing apparatus 61 includes a suction device 291, and the suction device 291 sucks a gas inside the discharge pipe 290. The suction device 291 is, for example, a vacuum pump. Instead of the vacuum pump, an ejector may be used. Since the suction device 291 sucks the gas inside the discharge pipe 290, it is possible to drop the processing residues by a flow of the gas. As a result, the accumulation of the processing residues can be suppressed. The bevel removing apparatus 61 does not need to be equipped with the suction device 291 as long as the suction device 291 is connected to the bevel removing apparatus 61.

The bevel removing apparatus 61 includes a suction box 292, and the suction box 292 is provided at a portion of a suction path of the gas flowing from the discharge pipe 290 toward the suction device 291. The suction device 291 sucks the inside of the suction box 292 from above. The inside of the suction box 292 is hermetically sealed, an exhaust line 293 is mounted to a ceiling of the suction box 292, and the suction device 291 sucks the gas inside the discharge pipe 290 via the exhaust line 293 and the suction box 292. Within the suction box 292, the gas is light and is thus sucked upwards against gravity, whereas the processing residues are heavy and fall down due to the gravity. Since the gas and the processing residues can be separated, breakdown of the suction device 291 can be suppressed.

The bevel removing apparatus 61 includes a recovery box 294, and the recovery box 294 collects the processing residues falling from the discharge pipe 290. The recovery box 294 is disposed under the suction box 292, for example. An extension pipe 295 guides the processing residues falling from the discharge pipe 290 into the recovery box 294. The processing residues accumulated inside the recovery box 294 are regularly discarded.

The bevel removing apparatus 61 is equipped with a detector 296 configured to detect a failure in the fall of the processing residues. The detector 296 includes, for example, a weight sensor 297, and the weight sensor 297 detects, for example, a change in the weight of the recovery box 294. If the processing residues are accumulated during the fall, a weight increment of the recovery box 294 becomes small as compared to a processing amount. Here, an installation position of the weight sensor 297 is not particularly limited. By way of example, the weight sensor 297 may detect a change in the weight of the lower cup 280. In this case, as the processing residues are deposited in the lower cup 280, the weight of the lower cup 280 becomes heavy.

As the detector 296, a non-illustrated imaging sensor may be used. The imaging sensor is provided inside at least one of the lower cup 280, the discharge pipe 290, the suction box 292, the recovery box 294, and the extension pipe 295 to image the inside thereof. If the processing residues are accumulated during the fall, these processing residues will be captured on an image by the imaging sensor.

Since the detector 296 sends the detection result to a controller of the bevel removing apparatus 61 and the controller detects the failure in the fall of the processing residues, a user may be urged to perform maintenance of the bevel removing apparatus 61. For example, when the controller detects the failure in the fall of the processing residues, it sets off an alarm. The notification of the alarm is performed by an image or a sound. Further, the detection result of the weight sensor 297 may also be used to urge the user to dispose of the processing residues accumulated in the recovery box 294.

As shown in FIG. 8, the bevel removing apparatus 61 includes an upper cover 300 and an upper cover moving mechanism 310. The upper cover 300 is moved up and down between a closing position where it closes at least a part of an opening at an upper end of the lower cup 280 (see FIG. 9B) and an opening position where it opens the opening at the upper end of the lower cup 280 (see FIG. 9A). The upper cover moving mechanism 310 is, for example, a cylinder, and is configured to move the upper cover 300 up and down between the closing position and the opening position. Since the upper cover 300 is moved up and down between the closing position and the opening position, the carrying-in/ carrying-out of the combined substrate 150 to/from the chuck 220 and the prevention of scattering of the processing residues from the combined substrate 150 can be both achieved. In addition, the upper cover moving mechanism 310 may be configured to move the upper cover 300 in the horizontal direction as well as in the vertical direction.

When the internal transfer mechanism 270 transfers the combined substrate 150 before being processed from the first storage table 250 onto the chuck 220, the upper cover 300 stands by at the opening position. The internal transfer mechanism 270 passes through a gap between the upper cover 300 and the lower cup 280, and hands the combined substrate 150 over to the chuck 220, as shown in FIG. 8. Then, after the internal transfer mechanism 270 is retreated from the gap between the upper cover 300 and the lower cup 280, the upper cover 300 is lowered from the opening position to the closing position. Then, while the processing unit 330 is processing the combined substrate 150 with the blade 160, the upper cover 300 suppresses the scattering of the processing residues at the closing position. Upon the completion of the processing of the combined substrate 150, the upper cover 300 is raised from the closing position to the opening position. Thereafter, the internal transfer mechanism 270 passes through the gap between the upper cover 300 and the lower cup 280, receives the processed combined substrate 150 from the chuck 220, and transfers it onto the second storage table 260.

As shown in FIG. 8, the position where the combined substrate 150 is stored on the second storage table 260 may be lower than the opening position of the upper cover 300. As compared to a case where the positional relationship is the reverse, the bevel removing apparatus 61 can be downsized. If the positional relationship is the reverse, the combined substrate 150 passes through the gap between the upper cover 300 and the second storage table 260 and rises higher than the upper cover 300 and the second storage table 260. To enable this rise of the combined substrate 150, a distance between the upper cover 300 and the second storage table 260 in the horizontal direction becomes larger than the diameter of the combined substrate 150. According to the present exemplary embodiment, however, the distance between the upper cover 300 and the second storage table 260 in the horizontal direction can be shortened, and the bevel removing apparatus 61 can be downsized.

The upper cover 300 has an upper cylindrical member 301 surrounding the outer periphery of the combined substrate 150 held by the chuck 220, as illustrated in FIG. 9B. Even when the lower cylindrical member 281 of the lower cup 280 is disposed below the combined substrate 150, the upper cylindrical member 301 of the upper cover 300 can suppress the scattering of the processing residues from the combined substrate 150 in a transversal direction. The upper cylindrical member 301 is formed in, for example, a cylindrical shape, and has a diameter larger than that of the combined substrate 150. The upper cylindrical member 301 may have a groove 302 to avoid interference between the upper cylindrical member 301 and the processing unit 330. Since the diameter of the upper cylindrical member 301 can be reduced, the upper cover 300 can be downsized. For example, the blade 160 and a blade mounting unit 331 may be disposed in the groove 302.

The upper cover 300 has a ceiling member 303 that covers at least the outer periphery of the combined substrate 150 held by the chuck 220 from above. The ceiling member 303 is formed in, for example, a ring shape. An outer diameter of the ceiling member 303 is larger than the diameter of the combined substrate 150, and an inner diameter of the ceiling member 303 is smaller than the diameter of the combined substrate 150. Alternatively, the ceiling member 303 may be formed in a disk shape, and may cover the entire combined substrate 150 from above. Since the ceiling member 303 covers at least the outer periphery of the combined substrate 150 from above, it is possible to suppress the scattering of the processing residues from the combined substrate 150 in an upward direction.

FIG. 11 is a cross sectional view illustrating an example of a gas flow formed around the outer periphery of the combined substrate during the processing. Since the suction device 291 sucks the gas inside the discharge pipe 290 as described above, the gas inside the lower cup 280 is also sucked. As a result, since the inside of the lower cup 280 is turned into a negative pressure, the gas flows from an opening of the ring-shaped ceiling member 303 into the lower cup 280. The gas flows into the lower cup 280 through a gap formed between the ceiling member 303 and the combined substrate 150. Since the gas forms a diametrically outward flow on a top surface of the combined substrate 150, the processing residues can be dropped from the combined substrate 150 into the lower cup 280 owing to the gas flow. Thus, the adhesion of the processing residues to the top surface of the combined substrate 150 can be suppressed.

Near the combined substrate 150, a gas flow is also formed due to the rotation of the combined substrate 150. The gas flows outwards in the diametrical direction by a centrifugal force while being drawn to and rotated along the combined substrate 150.

The ceiling member 303 has a ring-shaped first horizontal member 304 forming a gap with respect to the combined substrate 150; and a ring-shaped second horizontal member 305 forming a gap smaller than the gap formed by the first horizontal member 304 at an inner side than the first horizontal member 304. By narrowing the gas flow by the second horizontal member 305, it is possible to increase a flow velocity of the gas in the same principle as in a venturi tube, so that the gas flow can be strengthened.

The ceiling member 303 may have a ring-shaped first inclined portion 306 which connects the first horizontal member 304 and the second horizontal member 305. The first inclined portion 306 is inclined upwards as it goes outwards in the diametrical direction. The first horizontal member 304 may be disposed directly above the outer periphery of the combined substrate 150. Further, the ceiling member 303 may have a ring-shaped second inclined portion 307 which connects the first horizontal member 304 and the upper cylindrical member 301. The second inclined portion 307 is inclined downwards as it goes outwards in the diametrical direction.

The bevel removing apparatus 61 may have an upper nozzle 308, which is configured to discharge a gas toward the combined substrate 150 from above in order to form a gas flow flowing outwards in the diametrical direction from the outer periphery of the combined substrate 150 held by the chuck 220. Since the gas forms such a diametrically outward flow on the top surface of the combined substrate 150, the processing residues can be dropped from the combined substrate 150 into the lower cup 280 due to this gas flow. Thus, the adhesion of the processing residues to the top surface of the combined substrate 150 can be suppressed. The upper nozzle 308 is formed in, for example, a ring shape, and forms the gas flow over the entire outer periphery of the combined substrate 150. The upper nozzle 308 may be moved together with the upper cover 300 in order to suppress the interference between the upper nozzle 308 and the internal transfer mechanism 270.

The bevel removing apparatus 61 may have a lower nozzle 309, which is configured to discharge a gas toward the combined substrate 150 from below in order to form a gas flow flowing outwards in the diametrical direction from the outer periphery of the combined substrate 150 held by the chuck 220. A substrate holding surface 221 of the chuck 220 is smaller than the diameter of the combined substrate 150, and a bottom surface of the combined substrate 150 projects diametrically outwards from the chuck 220 over the entire circumference thereof. The lower nozzle 309 discharges the gas toward the projecting portion of the combined substrate 150 from diagonally below. Since the gas forms a diametrically outward flow on the bottom surface of the combined substrate 150, the adhesion of the processing residues to the bottom surface of the combined substrate 150 can be suppressed. The lower nozzle 309 is formed in, for example, a ring shape, and forms the gas flow over the entire outer periphery of the combined substrate 150.

The lower nozzle 309 is provided at, for example, the cylindrical member 241 of the protective cup 240, and a gas path, which is directed upwards as it goes outwards in the diametrical direction, is formed between the lower nozzle 309 and an inclined surface 222 of the chuck 220. The gas is supplied from a gas supply 311 into the cylindrical member 241, and the inside of the cylindrical member 241 is turned into a positive pressure. The gas in the cylindrical member 241 is discharged by the lower nozzle 309. Thus, the processing residues can be suppressed from entering the cylindrical member 241, so that breakdown of the rotating mechanism 230 disposed inside the cylindrical member 241 can be suppressed. In addition, the protective cup 240 is disposed inside the lower cup 280, as shown to FIG. 9A and FIG. 9B. The lower cup 280 and the protective cup 240 may be supported by the same supporting column 211.

As shown in FIG. 8, the bevel removing apparatus 61 includes an imaging sensor 320 configured to image the outer periphery of the combined substrate 150 (more specifically, the processing target substrate 100) held by the chuck 220. Further, as shown in FIG. 7, the bevel removing apparatus 61 is equipped with an imaging sensor moving mechanism 321 configured to move the imaging sensor 320 between an imaging position and a standby position. The imaging position is a position where the imaging sensor 320 images the outer periphery of the combined substrate 150 between the upper cover 300 and the lower cup 280. The standby position is a position where the imaging sensor 320 stays out of an elevation range of the upper cover 300. According to the present exemplary embodiment, the processing of the combined substrate 150 and the imaging of the combined substrate 150 can be performed in the state that the combined substrate 150 is held by the same chuck 220. As compared to a case where a chuck for the processing and a chuck for the imaging are provided separately, the number of times of the transfer of the combined substrate 150 can be reduced, and the position deviation of the combined substrate 150 that might be caused by the transfer can be suppressed.

While the processing unit 330 is processing the combined substrate 150 with the blade 160, the upper cover 300 suppresses the scattering of the processing residues at the closing position. Since the imaging sensor 320 stands by at the standby position when the combined substrate 150 is processed, the scattering of the processing residues to the imaging sensor 320 can be suppressed, so that breakdown of the imaging sensor 320 can be suppressed. Upon the completion of the processing of the combined substrate 150, the upper cover 300 is raised from the closing position to the opening position. Thereafter, the imaging sensor moving mechanism 321 moves the imaging sensor 320 from the standby position to the imaging position, and the imaging sensor 320 images the outer periphery 103 of the processing target substrate 100. In the meantime, the rotating mechanism 230 rotates the processing target substrate 100, and the imaging sensor 320 images the entire outer periphery 103 of the processing target substrate 100. When the imaging is finished, the imaging sensor moving mechanism 321 moves the imaging sensor 320 from the imaging position to the standby position. Subsequently, the internal transfer mechanism 270 passes through the gap between the upper cover 300 and the lower cup 280, receives the processed combined substrate 150 from the chuck 220, and transfers it onto the second storage table 260.

Figure 12:
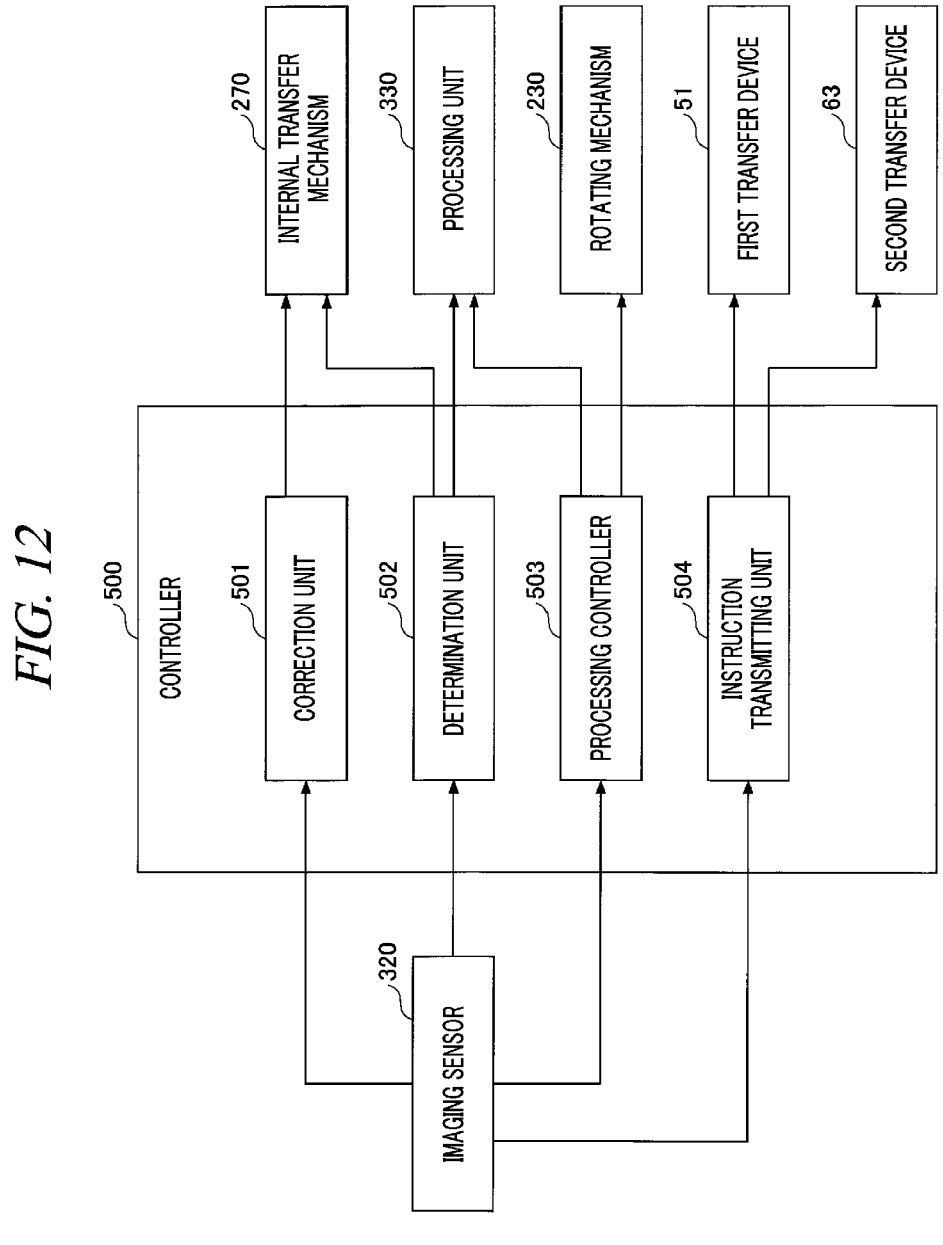
FIG. 12 is a functional block diagram illustrating constituent components of a controller according to the exemplary embodiment.

FIG. 12 is a functional block diagram illustrating constituent components of a controller according to the exemplary embodiment. Individual functional blocks shown in FIG. 12 are conceptual and may not necessarily be physically configured exactly the same as shown in FIG. 12. All or a part of the functional blocks may be functionally or physically dispersed or combined on a unit. All or a part of processing functions performed in the respective functional blocks may be implemented by a program executed by the CPU or implemented by hardware through a wired logic. A controller 500 is implemented by a computer as a part of the bevel removing apparatus 61, the same as the control device 9. Further, the control device 9 may have the function of the controller 500.

The controller 500 is equipped with a correction unit 501 configured to calculate a deviation between a rotation center of the chuck 220 and the center of the combined substrate 150 by image-processing the image captured by the imaging sensor 320, and to correct a path through which the internal transfer mechanism 270 transfers the combined substrate 150 such that the deviation is reduced next time. By way of example, the center of the combined substrate 150 is calculated as a center of a circle passing through three points on the outer periphery 103 of the processing target substrate 100 measured by the image-processing. The path corrected by the correction unit 501 is a path through which the combined substrate 150 is transferred from the first storage table 250 to the chuck 220.

The correction unit 501 corrects at least one of a start point or an end point of the path. The start point of the path is a position where the holder 272 of the internal transfer mechanism 270 receives the combined substrate 150 from the first storage table 250, that is, a position where the holder 272 holds the combined substrate 150. The end point of the path is a position where the holder 272 of the internal transfer mechanism 270 hands the combined substrate 150 over to the chuck 220, that is, a position where the combined substrate 150 is separated from the holder 272.

Since the correction unit 501 corrects at least one of the start point or the end point of the path, the deviation between the rotation center of the chuck 220 and the center of the combined substrate 150 can be reduced. When the chuck 220 is rotated, it is possible to suppress the combined substrate 150 from being shaken to be deviated. If the combined substrate 150 is shaken to be deviated, the insertion depth of the blade 160 varies depending on the position of the combined substrate 150 in the circumferential direction. The insertion depth of the blade 160 is an insertion depth into the gap between the processing target substrate 100 and the support substrate 130. If the insertion depth of the blade 160 is too large, a load applied to the blade 160 is too large, resulting in a failure such as deformation of the blade 160. If the insertion depth of the blade 160 is too small, on the other hand, a load applied to the combined substrate 150 is too small, resulting in a failure to remove the bevel 104. According to the present exemplary embodiment, since the correction unit 501 can suppress the deviation of the combined substrate 150, these problems can be avoided.

Further, the controller 500 may be equipped with an instruction transmitting unit 504 configured to image-process the image captured by the imaging sensor 320, calculate the deviation between the rotation center of the chuck 220 and the center of the combined substrate 150, and send an instruction to at least one of the first transfer device 51 or the second transfer devices 63. The instruction transmitting unit 504 sends the first transfer device 51 an instruction for correcting a position where the first transfer device 51 hands the combined substrate 150 before being processed over to the first storage table 250 such that the deviation is reduced next time. Further, the instruction transmitting unit 504 further calculates a position deviation of the combined substrate 150 on the second storage table 260 from the deviation between the rotation center of the chuck 220 and the center of the combined substrate 150, and sends the second transfer device 63 an instruction for correcting a position where the second transfer device 63 receives the combined substrate 150 after being processed from the second storage table 260. The second transfer device 63 can maintain a required position of the combined substrate 150 after being processed.

In addition, the controller 500 includes a determination unit 502 configured to image-process the image captured by the imaging sensor 320 and determine whether or not the processing result of the combined substrate 150 is good or bad. The determination unit 502 calculates a position of the outer periphery 103 of the processing target substrate 100 after being processed through the image processing, and determines whether the diameter of the processing target substrate 100 is reduced such that the entire outer periphery 103 of the processing target substrate 100 reaches the first division surface D1. If the diameter of the processing target substrate 100 is found to be reduced such that the entire outer periphery 103 of the processing target substrate 100 reaches the first division surface D1, a determination that the processing result is good is made. On the other hand, if at least a part of the outer periphery 103 of the processing target substrate 100 does not reach the first division surface D1, there is made a determination that the processing result is bad. The combined substrate 150 having the poor processing result may be processed again in the bevel removing apparatus 61 after changing a processing condition (for example, a load of the blade 160 in the processing) before being transferred to the thinning apparatus 62, or may not be transferred to the thinning apparatus 62 but be returned to the cassette CS on the placing member 21.

Figure 13:
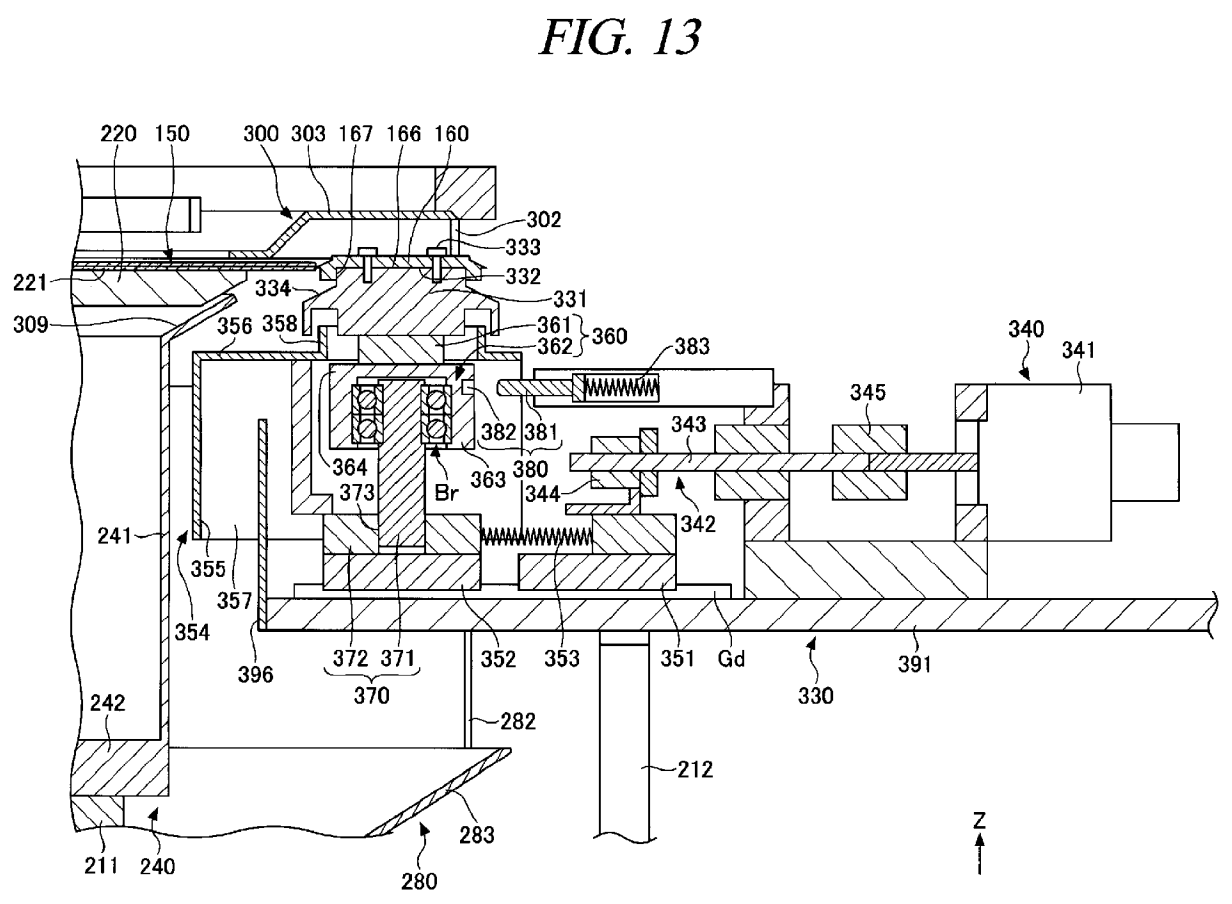

FIG. 13 is an enlarged view of the processing unit shown in FIG. 9B. The bevel removing apparatus 61 is equipped with the processing unit 330 configured to process the combined substrate 150 (more specifically, the processing target substrate 100) by pressing the horizontal blade 160 against the outer periphery of the combined substrate 150. The blade 160 is pressed against the outer periphery of the combined substrate 150 and passively rotated along with the rotation of the combined substrate 150. The rotational direction of the blade 160 is opposite to the rotational direction of the combined substrate 150, and since the rotational speed of the outer periphery of the blade 160 and the rotational speed of the outer periphery of the combined substrate 150 are the same, damage to the combined substrate 150 and the blade 160 can be suppressed. Alternatively, the blade 160 may be rotated independently of the combined substrate 150.

The blade 160 includes, as shown in FIG. 5, for example, a horizontal lower disk member 161, a wedge-shaped blade member 162, and a horizontal upper disk member 163 in this order from the lower side toward the upper side. The blade portion 162 protrudes diametrically outwards from both of the lower disk member 161 and the upper disk member 163, and includes a horizontal surface 164 and an inclined surface 165 at a leading end thereof. The inclined surface 165 slopes downwards as it goes outwards in the diametrical direction. The horizontal surface 164 of the blade member 162 is in contact with a top surface of the support substrate 130, and the inclined surface 165 of the blade member 162 pushes a to-be-removed portion (for example, the fragments 107) of the processing target substrate 100 upwards. Since the blade 160 is a consumable, it is replaced appropriately.

The processing unit 330 has a blade mounting unit 331 to which the blade 160 is mounted, as shown in FIG. 13. The blade mounting unit 331 has a horizontal mounting surface 332, and this mounting surface 332 is provided with a plurality of bolt holes formed at a certain distance therebetween. A bolt 333 is inserted into each of the plurality of bolt holes, and the blade 160 is mounted to the blade mounting unit 331 by the bolts 333 in a replaceable manner. A non-illustrated magnet may be used instead of the bolt 333. The magnet may be either a permanent magnet or an electromagnet.

The blade 160 has a flat surface 166 in contact with the mounting surface 332 of the processing unit 330. The flat surface 166 is formed in a recess 167 on a bottom surface of the blade 160, for example. The flat surface 166 and the horizontal surface 164 (see FIG. 5) are parallel to each other, and they have a required height difference, or are disposed on the same plane. Either way, the height of the horizontal surface 164 and the horizontality of the horizontal surface 164 can be maintained before and after the replacement of the blade 160.

The processing unit 330 has a driving unit 340 configured to move the blade mounting unit 331 back and forth in directions in which the blade mounting unit 331 is connected to or disconnected from the chuck 220. By moving back and forth the blade 160, which is lighter than the chuck 220, instead of moving the chuck 220 back and forth, a driving force required for connecting or disconnecting the blade 160 and the combined substrate 150 can be reduced.

The driving unit 340 includes, for example, a rotary motor 341 and a ball screw 342 configured to convert a rotary motion of the rotary motor 341 into a linear motion. The ball screw 342 includes a screw shaft 343 and a screw nut 344. The screw shaft 343 is connected to an output shaft of the rotary motor 341 via a coupling 345, for example, and is rotated along the output shaft. Meanwhile, the screw nut 344 is made to move back and forth by the rotation of the screw shaft 343, and, as a result, the blade mounting unit 331 is moved back and forth.

The processing unit 330 includes a first slider 351 configured to be moved back and forth by the driving unit 340, a second slider 352 configured to be moved back and forth along with the first slider 351, and an elastic body 353 connecting the first slider 351 and the second slider 352. By way of non-limiting example, a coil spring is used as the elastic body 353. The screw nut 344 is provided to the first slider 351, and the blade mounting unit 331 is provided to the second slider 352. The blade mounting unit 331 is moved back and forth along with the second slider 352. The second slider 352 is disposed in front of the first slider 351.

If the combined substrate 150 before being processed is held by the chuck 220, the first slider 351 advances from a standby position to a processing position, and the second slider 352 is moved forwards via the elastic body 353, pressing the blade 160 against the combined substrate 150. If the processing position of the first slider 351 is located further forward, a distance between the first slider 351 and the second slider 352 becomes shorter, and an elastic restoring force of the elastic body 353 becomes stronger, so that the load of the blade 160 is increased. During the processing, the first slider 351 is stopped at the processing position.

Upon the completion of the processing, the first slider 351 is returned from the processing position to the standby position, and the second slider 352 is retreated via the elastic body 353, separating the blade 160 from the combined substrate 150.

However, if the rotation center of the chuck 220 and the center of the combined substrate 150 are deviated and eccentricity occurs, the combined substrate 150 is shaken to be deviated when the chuck 220 is rotated. The elastic body 353 elastically deforms in an advancing/retreating direction of the blade 160 in order to move the blade 160 back and forth to absorb the deviation of the combined substrate 150. According to the present exemplary embodiment, since the elastic body 353 absorbs the deviation of the combined substrate 150, the above-mentioned problem caused by the deviation can be solved.

In addition, in the absence of the elastic body 353, not only the screw nut 344 but also the blade mounting unit 331 is provided to the first slider 351. In this case, a processing controller 503 shown in FIG. 12 may adjust the processing position of the first slider 351 forwards and backwards to move the blade 160 back and forth so as to absorb the deviation of the combined substrate 150 caused by the eccentricity. However, when the elastic body 353 is present, it is possible to absorb the deviation of the combined substrate 150 in the state that the processing position of the first slider 351 fixed. Thus, the control by the processing controller 503 can be eased.

The processing unit 330 has a rotation supporting mechanism 360 configured to support the blade mounting unit 331 rotatably. The rotation supporting mechanism 360 has a rotation shaft 361, a bearing box 362, and a bearing Br. The blade mounting unit 331 is fixed to the bearing box 362 via the vertical rotation shaft 361. The bearing box 362 has a cylindrical member 363 which holds an outer ring of the bearing Br; and a lid 364 which closes an opening at an upper end of the cylindrical member 363. The rotation shaft 361 is fixed to the lid 364. A height adjustment shaft 371 is vertically disposed on an extension line of the rotation shaft 361, and the height adjustment shaft 371 holds an inner ring of the bearing Br. The blade mounting unit 331 is rotatably supported by the bearing Br.

The processing unit 330 has a height adjusting mechanism 370 configured to adjust the height of the mounting surface 332 of the blade mounting unit 331 with respect to the substrate holding surface 221 of the chuck 220. The height adjusting mechanism 370 includes, for example, the height adjustment shaft 371 and a height adjustment base 372. The height adjustment shaft 371 has a screw shaft 373, and the screw shaft 373 is inserted into a screw hole, which is formed at the height adjustment base 372. By rotating the height adjustment shaft 371, the height adjustment shaft 371 can be moved up and down to adjust the height of the mounting surface 332 of the blade mounting unit 331. The height adjustment base 372 is fixed to the second slider 352, and the blade mounting unit 331 is provided to the second slider 352 with the height adjusting mechanism 370 and the rotation supporting mechanism 360 therebetween.

Here, the configuration of the height adjusting mechanism 370 is not particularly limited. For example, the height adjusting mechanism 370 may have an actuator configured to move the height adjustment shaft 371 up and down. As such an actuator, a piezo element or the like may be used. The height adjustment shaft 371 can be moved up and down automatically by the actuator. The actuator is mounted to the height adjustment base 372.

The processing unit 330 has a rotation restricting mechanism 380 configured to restrict the rotation of the blade mounting unit 331. The rotation restricting mechanism 380 has a stopper pin 381; and a pin hole 382 into which the stopper pin 381 is fitted. The pin hole 382 is formed on an outer peripheral surface of the cylindrical member 363 of the bearing box 362, and is moved back and forth along with the bearing box 362. If the driving unit 340 moves the bearing box 362 backwards and the stopper pin 381 is fitted into the pin hole 382, the rotation of the bearing box 362 is restricted, and, as a result, the rotation of the blade mounting unit 331 is restricted. Since the blade 160 can be replaced in this state, the replacement of the blade 160 can be carried out easily.

Since the pin hole 382 is rotated along with the bearing box 362, it may be deviated from an extension line of the stopper pin 381 when the rotation of the bearing box 362 is stopped. In this state, if the driving unit 340 retreats the bearing box 362, the bearing box 362 comes into contact with a front end of the stopper pin 381. The stopper pin 381 can be moved in an advancing/retreating direction of the bearing box 362, and a force is applied by an elastic body 383 such as a coil spring toward an advanced position. If the stopper pin 381 is pushed backwards by the bearing box 362, the elastic body 383 elastically deforms to allow the stopper pin 381 to retreat. Thereafter, if the pin hole 382 is placed on the extension line of the stopper pin 381 by rotating the bearing box 362, the stopper pin 381 is pushed back to the advanced position by an elastic restoring force of the elastic body 383 and fitted into the pin hole 382.

The processing unit 330 is equipped with a parallelism adjusting mechanism 390 configured to adjust the parallelism of the mounting surface 332 of the blade mounting unit 331 with respect to the substrate holding surface 221 of the chuck 220, as shown in FIG. 9A and FIG. 9B. The parallelism adjusting mechanism 390 includes a plurality of (for example, three) height adjusters 392 configured to adjust the heights of different portions of a base plate 391, as shown in FIG. 7.

A guide rail Gd is fixed to the base plate 391, and the guide rail Gd guides the first slider 351 and the second slider 352. The blade mounting unit 331 is installed to the base plate 391 with the guide rail Gd, the second slider 352, and so forth therebetween.

The height adjusters 392 are respectively mounted to upper ends of a plurality of (for example, three) supporting columns 212, and lower ends of the supporting columns 212 are mounted to the base 210. By adjusting the heights of three points of the base plate 391, the parallelism of the mounting surface 332 of the blade mounting unit 331 can be adjusted.

The height adjuster 392 is a so-called leveling bolt, and has, for example, a screw nut 393, a screw shaft 394, and a fastening bolt 395. The screw nut 393 is fixed to the base plate 391. The screw shaft 394 is inserted into a screw hole of the screw nut 393 and into a through hole of the base plate

391 to come into contact with an upper end surface of the supporting column 212 rotatably. A screw hole is formed in the upper end surface of the supporting column 212, and the fastening bolt 395 is inserted into this screw hole. The fastening bolt 395 penetrates the inside of the cylindrical screw shaft 394 and is inserted into the screw hole of supporting column 212. The screw hole of the supporting column 212 has an outer diameter smaller than an inner diameter of the cylindrical screw shaft 394, and the screw shaft 394 is in contact with the upper end surface of the supporting column 212 rotatably.

When adjusting the height of each point of the base plate 391, the fastening bolt 395 is first loosened, and, then, the screw shaft 394 is rotated to move the screw nut 393 up and down. Thereafter, if the fastening bolt 395 is tightened, the height can be fixed.

Here, the height adjuster 392 may have an actuator instead of the leveling bolt. As the actuator, a piezo element or the like may be used, for example. The height of each point of the base plate 391 can be adjusted automatically by the actuator.

Moreover, since the parallelism adjusting mechanism 390 has the height adjusters 392, they may also be used as the height adjusting mechanism 370. However, the parallelism adjusting mechanism 390 may be provided separately from the height adjusting mechanism 370. The height adjusting mechanism 370 adjusts the height of the mounting surface 332 of the blade mounting unit 331 with respect to the substrate holding surface 221 of the chuck 220 while maintaining the parallelism adjusted by the parallelism adjusting mechanism 390. Thus, if the height adjusting mechanism 370 and the parallelism adjusting mechanism 390 are separately provided, the number of times of the adjustment of the parallelism, which features a high level of difficulty, can be reduced.

The processing unit 330 may additionally have a processing cover 354 configured to be moved back and forth along with the second slider 352, as shown in FIG. 13. The processing cover 354 has, for example, a front plate 355, a top plate 356, and a pair of left and right side plates 357. The front plate 355 is vertically disposed and faces the cylindrical member 241 of the protective cup 240. The top plate 356 has a through hole through which the rotation shaft 361 is inserted. The processing cover 354 has a cylindrical member 358 extending upwards from an edge of the through hole of the top plate 356. The cylindrical member 358 is disposed inside a skirt member 334 of the blade mounting unit 331, and a labyrinth structure is formed between the cylindrical member 358 and the skirt member 334. The processing cover 354 accommodates therein the rotation supporting mechanism 360 and at least a part of the height adjusting mechanism 370, and serves to suppress scattering of processing residues to the rotation supporting mechanism 360 and the height adjusting mechanism 370.

The processing unit 330 may have a partition 396 extending upwards from a front end of the base plate 391 to partition the inside of the processing cover 354, as shown in FIG. 13. The partition 396 is vertically disposed behind the front plate 355 of the processing cover 354 and in front of the guide rail Gd, and a labyrinth structure is formed between the partition 396 and the front plate 355. The partition 396 serves to suppress the scattering of processing residues to the rotation supporting mechanism 360, the height adjusting mechanism 370, and the guide rail Gd in cooperation with the front plate 355 of the processing cover 354.

Figure 14A:
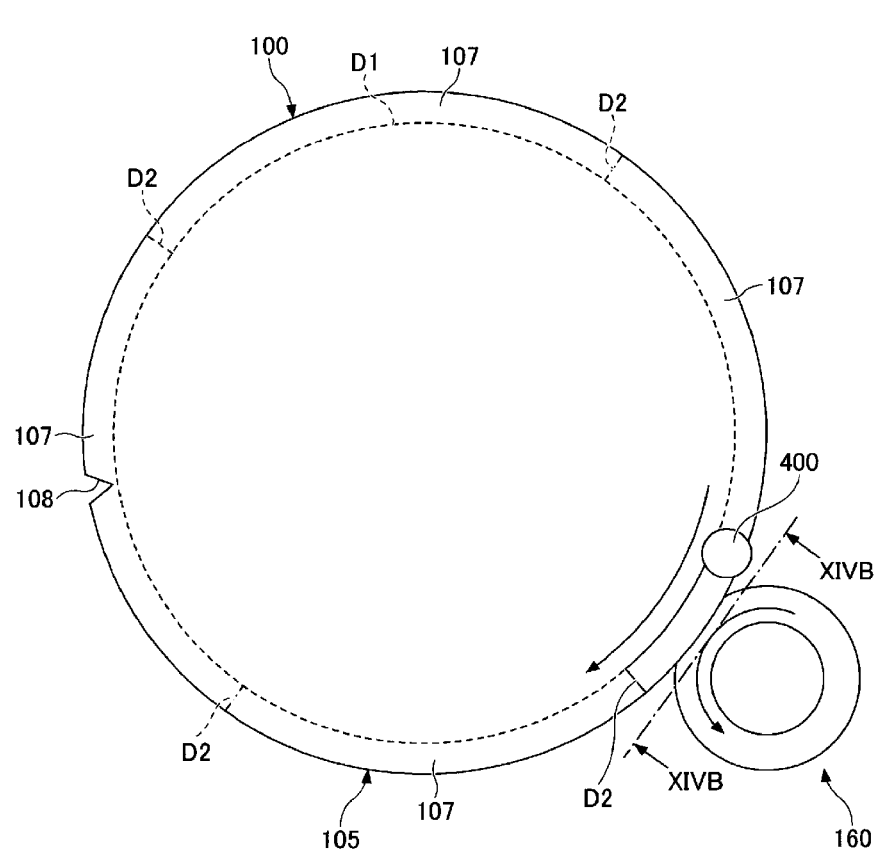
FIG. 14A is a plan view illustrating a pressing device according to the exemplary embodiment.
Figure 14B:
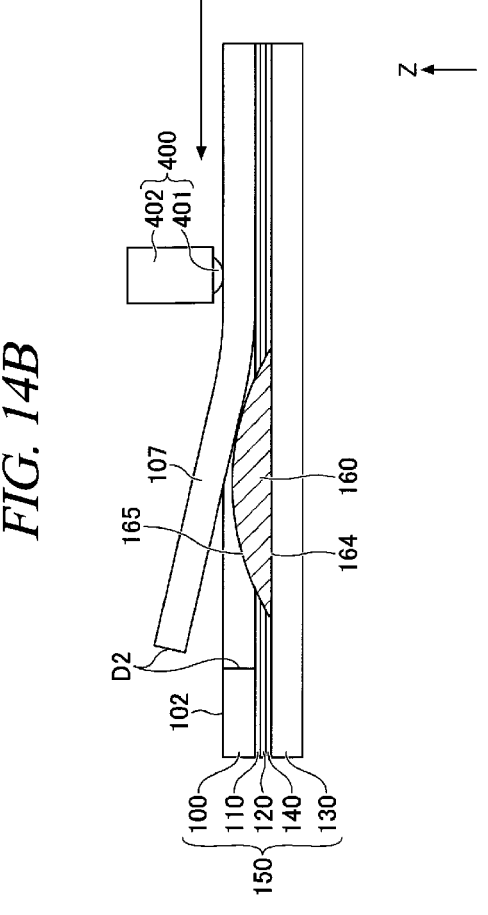
FIG. 14B is a cross sectional view taken along a line XIVB-XIVB of FIG. 14A.

FIG. 14A is a plan view showing a pressing device according to the exemplary embodiment. FIG. 14B is a cross-sectional view taken along a line XIVB-XIVB of FIG. 14A. As illustrated in FIG. 14A and FIG. 14B, the bevel removing apparatus 61 may be equipped with a pressing device 400. The pressing device 400 presses the fragment 107, which is to be pushed up from the processing target substrate 100 by the blade 160, from above while maintaining a certain distance from the blade 160 in the circumferential direction of the processing target substrate 100. The fragment 107 is of a circular arc shape when viewed from a top surface thereof which is divided along the first division surface D1 and the second division surface D2. The fragment 107 includes the bevel 104. As illustrated in FIG. 14B, the pressing device 400 presses a portion of the processing target substrate 100 at the rear of the blade 160 in the rotational direction. The fragment 107 can be pushed up at a sharp angle by the pressing device 400, and the division along the second division surface D2 can be accelerated.

The pressing device 400 has, for example, a ball 401 pressed onto the fragment 107, and a support 402 configured to support the ball 401 rotatably. Since the ball 401 is in contact with the fragment 107 on a spherical surface, frictional resistance between the ball 401 and the fragment 107 can be reduced. In addition, since the support 402 rotatably supports the ball 401, the frictional resistance between the ball 401 and the fragment 107 can be further reduced.

The pressing device 400 may be fixed to the upper cover 300, and may be moved up and down along with the upper cover 300. When the upper cover 300 descends to the closing position, the pressing device 400 is pressed against the fragment 107. The pressing device 400 may be fixed to the upper cover 300 with an elastic body such as a coil spring therebetween. The elastic body presses the pressing device 400 against the fragment 107 by its elastic restoring force.

Figure 15:
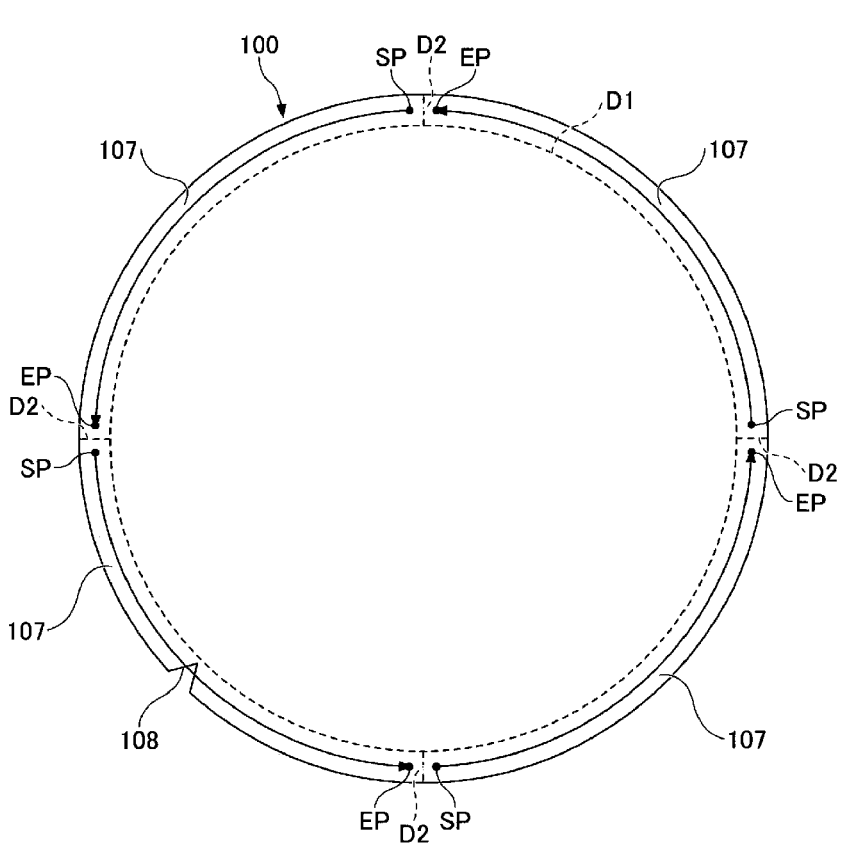
FIG. 15 is a plan view illustrating an example of a range of the outer periphery of the combined substrate that comes into contact with a blade.

FIG. 15 is a plan view showing an example of a range of the outer periphery of the combined substrate in contact with the blade. The controller 500 includes, as shown in FIG. 12, the processing controller 503 configured to control the rotating mechanism 230 of the chuck 220 and the processing unit 330. As shown in FIG. 15, the processing controller 503 moves the blade 160 back and forth so that a part (for example, the second division surface D2) of the outer periphery of the combined substrate 150 does not come into contact with the blade 160 while the combined substrate 150 is being rotated along with the chuck 220. In FIG. 15, SP indicates a contact start point at which the blade 160 starts to come into contact with the outer periphery of the combined substrate 150, and EP refers to a contact end point at which the blade 160 starts to separate from the outer periphery of the combined substrate 150. The second division surface D2 is disposed between the contact start point SP and the contact end point EP.

If the combined substrate 150 before being processed is held by the chuck 220, the imaging sensor moving mechanism 321 moves the imaging sensor 320 from the standby position to the imaging position before the first slider 351 advances from the standby position to the processing position, and the imaging sensor 320 images a notch 108 of the processing target substrate 100. The notch 108 indicates a crystal orientation of the processing target substrate 100 and is formed at the outer periphery 103 of the processing target substrate 100. Instead of the notch 108, an orientation flat may be formed at the outer periphery 103 of the processing target substrate 100. When the imaging of the notch 108 is finished, the imaging sensor moving mechanism 321 moves the imaging sensor 320 from the imaging position to the standby position.

The processing controller 503 image-processes the image of the notch 108 captured by the imaging sensor 320, and measures a position of the notch 108. A relationship between the position of the notch 108 and a position of the second division surface D2 is previously stored in a recording medium. The processing controller 503 detects the position of the second division surface D2 from the measured position of the notch 108 based on the relation previously stored in the recording medium.

The processing controller 503 moves the blade 160 back and forth to avoid the position of the second division surface D2 when the blade 160 is pressed against the outer periphery of the processing target substrate 100 while the processing target substrate 100 is being rotated. For example, if the blade 160 comes into contact with the second division surface D2, an impact is generated at that timing because the second modification layer M2 is formed on the second division surface D2. If the impact is large, the following problem may be caused. An unintended crack may be formed, and the fragment 107 may fall down from an unexpected position. Neighboring fragments 107 may fall without being divided along the second division surface D2, and pile up together. As a result, the lifetime of the blade 160 may be reduced. According to the present exemplary embodiment, since the processing controller 503 moves the blade 160 back and forth to avoid the position of the second division surface D2, this problem can be solved.

Figure 16:
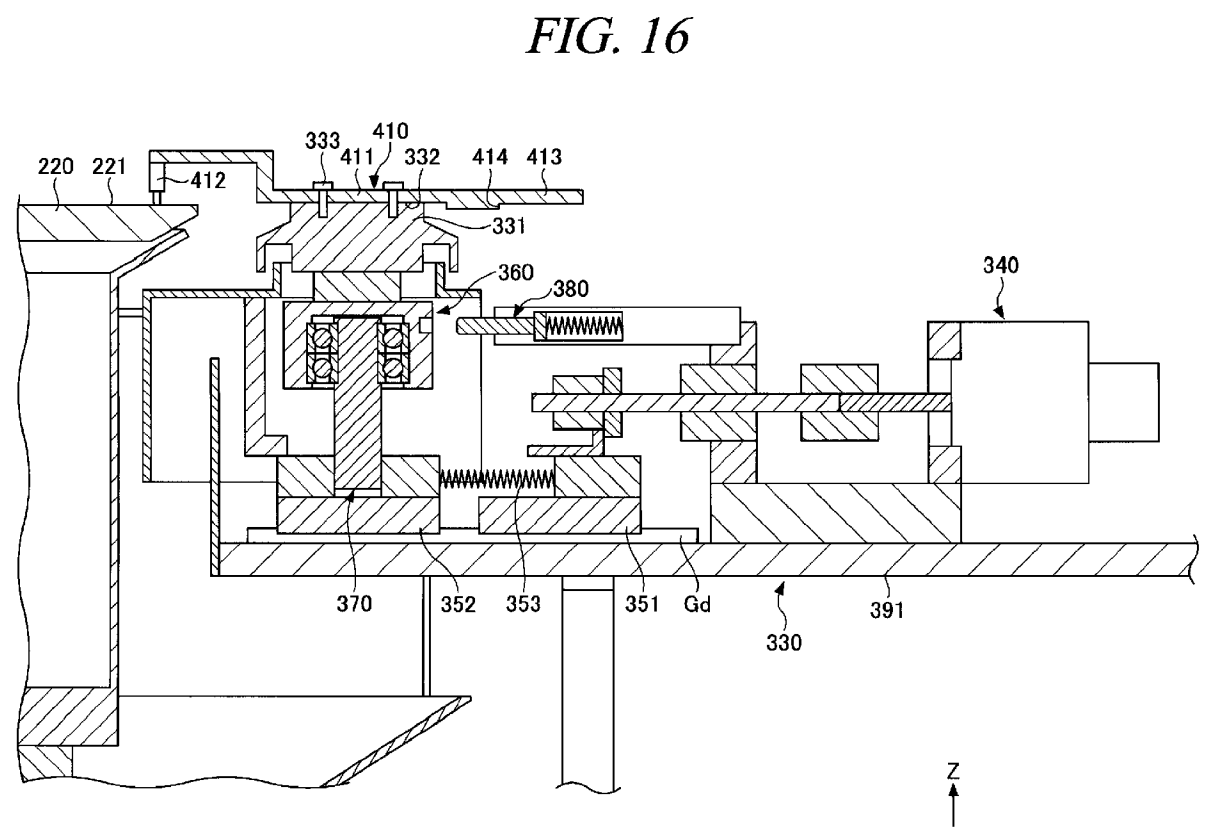
Figure 17:
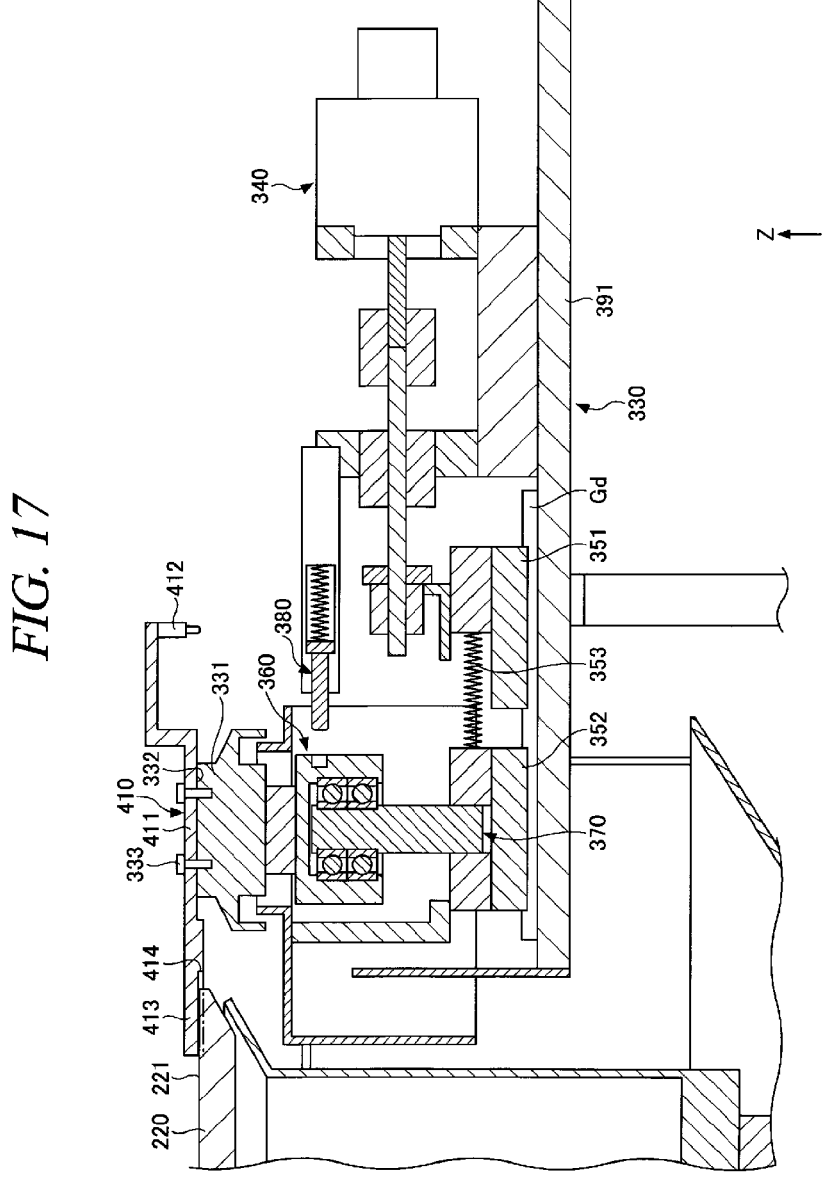
FIG. 17 is a cross sectional view showing a state in which a height is measured by a measuring device according to the exemplary embodiment.

FIG. 16 is a cross sectional view showing a state in which the horizontality is measured by a measuring device according to the exemplary embodiment. FIG. 17 is a cross sectional view showing a state in which the height is measured by a measuring device according to the exemplary embodiment. As shown in FIG. 16 and FIG. 17, the processing unit 330 includes a measuring device mounting unit to which a measuring device 410 is mounted. The blade mounting unit 331 is used as the measuring device mounting unit, and the measuring device 410 and the blade 160 are mounted interchangeably to the same mounting surface 332 of the blade mounting unit 331 by using the bolt 333 or the like. Instead of the bolt 333, a magnet may be used as mentioned above. As compared to a case where the measuring device mounting unit and the blade mounting unit 331 are separately provided, the processing unit 330 can be downsized.

The measuring device 410 is configured to measure at least one (both in the present exemplary embodiment) of the parallelism or the height of the mounting surface 332 of the blade 160 with respect to the substrate holding surface 221 of the chuck 220. As compared to a case of measuring the parallelism or the height with eyes without using the measuring device 410, the parallelism or the height can be precisely adjusted regardless of a skill level of an operator, so that the blade 160 can be properly and easily mounted.

The measuring device 410 includes, for example, a revolving arm 411 mounted on the mounting surface 332 of the blade mounting unit 331; and a height sensor 412 mounted to one end of the revolving arm 411. The height sensor 412 is configured to measure the height of the substrate holding surface 221 of the chuck 220. Although the height sensor 412 is of a contact type in the present exemplary embodiment, a non-contact type may be used instead.

The rotation supporting mechanism 360 rotatably supports the blade mounting unit 331 as described above. If the blade mounting unit 331 is rotated, the revolving arm 411 can be rotated, so that a height distribution of the substrate holding surface 221 of the chuck 220 with respect to the mounting surface 332 of the blade mounting unit 331 can be measured, and the parallelism can be calculated from the measured height distribution. If the mounting surface 332 becomes completely parallel to the substrate holding surface 221, a measurement value of the height sensor 412 does not change even if a rotation angle of the blade mounting unit 331 is changed.

As described above, the driving unit 340 moves the blade mounting unit 331 back and forth in the direction in which the blade mounting unit 331 is connected to or disconnected from the chuck 220. If the blade mounting unit 331 is moved back and forth, the revolving arm 411 can be moved back and forth, so that the height distribution of the substrate holding surface 221 of the chuck 220 with respect to the mounting surface 332 of the blade mounting unit 331 can be measured, and the parallelism can be calculated from the height distribution. If the mounting surface 332 becomes completely parallel to the substrate holding surface 221, the measurement value of the height sensor 412 does not change even if the blade mounting unit 331 is moved back and forth.

Based on the measurement result of the measuring device 410, the operator adjusts the parallelism of the blade mounting unit 331 with respect to the substrate holding surface 221 of the chuck 220 by using the parallelism adjusting mechanism 390 so that the parallelism falls within a predetermined tolerance range. The adjustment of the parallelism may be performed in the state that the measuring device 410 is mounted to the blade mounting unit 331. The adjustment of the parallelism and the measurement of the parallelism may be repeatedly performed until the degree of the parallelism falls within the predetermined tolerance range.

After the adjustment of the parallelism, the measurement of the height may be performed. Although the height sensor 412 may be used for the height measurement, a block gauge 413 may be used in the present exemplary embodiment. The block gauge 413 is mounted to the other end of the revolving arm 411. The block gauge 413 has a step-shaped portion 414.

Since the height sensor 412 and the block gauge 413 are mounted to the one and the same revolving arm 411, the operator reverses the blade mounting unit 331 from the state shown in FIG. 16 to the state shown in FIG. 17 after the parallelism is adjusted, thus allowing the block gauge 413 to be oriented toward the chuck 220. Based on whether or not the height of the substrate holding surface 221 of the chuck 220 is within the range of the step-shaped portion 414 of the block gauge 413, it can be confirmed whether or not the height of the mounting surface 332 of the blade mounting unit 331 is within the predetermined tolerance range. This confirmation may be performed with the eyes of the operator. When the height of the substrate holding surface 221 is not within the range of the step-shaped portion 414, the operator adjusts the height by using the height adjusting mechanism 370 until it comes within the range. The adjustment of the height is performed in the state that the measuring device 410 is mounted to the blade mounting unit 331.

After the adjustment of the height, the rotation restricting mechanism 380 restricts the rotation of the blade mounting unit 331. Then, the measuring device 410 is separated, and the blade 160 is mounted instead. Since this operation is performed in the state that the rotation of the blade mounting unit 331 is restricted, the exchange between the measuring device 410 and the blade 160 is carried out easily.

In addition, the height sensor 412 and the block gauge 413 may be mounted to the blade mounting unit 331 interchangeably. Furthermore, the block gauge 413 may not be mounted to the blade mounting unit 331 but be installed on the substrate holding surface 221 of the chuck 220, and whether or not the height of the mounting surface 332 of the blade mounting unit 331 is within the range of the step-shaped portion 414 of the block gauge 413 may be observed with the eyes.

So far, the exemplary embodiment of the substrate processing apparatus and the substrate processing method according to the present disclosure have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

In the above-described exemplary embodiment, the bevel removing apparatus 61 is used as the substrate processing apparatus. However, the substrate processing apparatus only needs to process the substrate by pressing the horizontal blade 160 on the outer periphery of the substrate, and the use of the substrate processing apparatus is not limited to removing the bevel 104.

Figure 18:
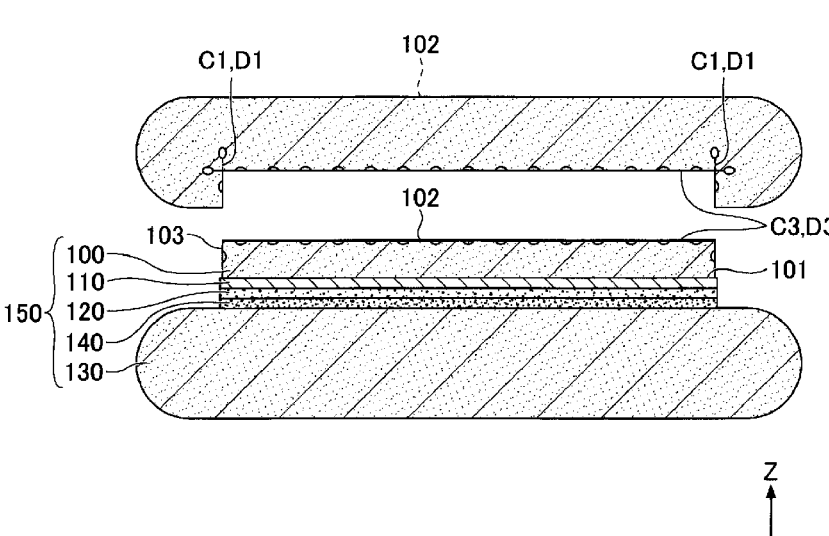
FIG. 18 is a cross sectional view illustrating a modification example of the bevel removing and the thinning shown in FIG. 6.

By way of example, in the substrate processing apparatus, the blade 160 may be inserted between the processing target substrate 100 and the support substrate 130 before the bevel removing and the thinning shown in FIG. 18 to extend the first crack C1 or both the first crack C1 and the third crack C3. Prior to the thinning, it is possible to form a crack that serves as a starting point of the bevel removing or the bevel removing and the thinning. That is, the substrate processing apparatus may be configured to form the crack serving as a starting point before performing the bevel removing and the thinning of the processing target substrate 100 simultaneously. In this case as well, dust generated during the formation of the crack can be reliably collected by the lower cup 280, so that the bevel removing apparatus 61 and the combined substrate 150 can be maintained clean.

FIG. 18 is a cross sectional view illustrating a modification example of the bevel removing and the thinning shown in FIG. 6. In this modification example shown in FIG. 18, the first crack C1 and the third crack C3 are extended by applying an external force to the processing target substrate 100. The first modification layer M1 is formed so that the first crack C1 does reach the first main surface 101 and does not reach the second main surface 102 before the thinning shown in FIG. 18. The third modification layer M3 is formed so that the third crack C3 intersects with the first division surface D1 and does not reach the outer periphery 103. The formation of the first modification layer M1 and the third modification layer M3 is performed by the laser processing apparatus 41. However, the second modification layer M2 is not formed here. Then, in the thinning apparatus 62 as shown in FIG. 6, bevel removal and thinning are performed at the same time, as shown in FIG. 18.

Furthermore, the substrate processing apparatus may form a crack serving as a starting point for peeling the combined substrate 150 into the processing target substrate 100 and the support substrate 130. In this case, the processing target substrate 100 and the support substrate 130 may be bonded to each other with an adhesive or the like.

The processing target substrate 100 is not limited to the silicon wafer. The processing target substrate 100 may be, for example, a silicon carbide wafer, a gallium nitride wafer, a gallium oxide wafer, or the like. In addition, the processing target substrate 100 may be a glass substrate. It is the same for the support substrate 130.

This application claims priority to Japanese Patent Application No. 2019-104802, field on Jun. 4, 2019, which application is hereby incorporated by reference in their entirety.

According to the exemplary embodiments, it is possible to appropriately collect the processing residue generated when the processing tool is pressed onto the outer periphery of the substrate, to thereby maintain a clean state.

We claim:

1. A substrate processing apparatus, comprising:
   a chuck configured to hold a substrate horizontally;
   a processing unit configured to press a processing tool against an outer periphery of the substrate held by the chuck to process the substrate; and
   a lower cup configured to collect a processing residue falling from the substrate over an entire circumference of the substrate,
   wherein:
      the lower cup is provided with a discharge opening through which the processing residue is discharged,
      the lower cup comprises a lower cylindrical member which is larger than the substrate when viewed from above, and a lower lid which closes a lower end opening of the lower cylindrical member,
      the discharge opening is formed at the lower lid, and
      the lower cylindrical member comprises a groove to avoid interference between the lower cylindrical member and the processing unit.

2. The substrate processing apparatus of claim 1, further comprising:
   a rotating mechanism configured to rotate the chuck around a vertical axis,
   wherein the processing unit presses the processing tool against the outer periphery of the substrate being rotated along with the chuck.

3. The substrate processing apparatus of claim 1,
   wherein the lower lid comprises the discharge opening at a center thereof, and comprises, over an entire circumference of the lower cylindrical member, an inclined surface inclined downwards from the lower cylindrical member toward the discharge opening.

4. The substrate processing apparatus of claim 1,
   wherein the lower cup is formed of a conductive material, formed of an insulating material and coated with an anti-static agent, or formed of a mixture of an insulating material and an anti-static agent.

5. The substrate processing apparatus of claim 1, further comprising:
   a discharge pipe through which the processing residue falling from the discharge opening of the lower cup is guided downwards,
   wherein the discharge pipe is formed of a conductive material, formed of an insulating material and coated with an anti-static agent, or formed of a mixture of an insulating material and an anti-static agent.

6. The substrate processing apparatus of claim 5, further comprising:
   a suction device configured to suck a gas within the discharge pipe.

7. The substrate processing apparatus of claim 6, further comprising:
   a suction box provided at a portion of a suction path of the gas flowing from the discharge pipe toward the suction device, wherein the suction device sucks an inside of the suction box from above.

8. The substrate processing apparatus of claim 1, further comprising:
a detector configured to detect a failure in the falling of the processing residue.

9. The substrate processing apparatus of claim 1, further comprising:
an upper cover configured to be moved up and down between a closing position where the upper cover closes at least a part of an upper end opening of the lower cup and an opening position where the upper cover opens the upper end opening of the lower cup.

10. The substrate processing apparatus of claim 1, further comprising:
an upper nozzle configured to discharge a gas toward the substrate from above to form a flow of the gas flowing outwards in a diametrical direction from the outer periphery of the substrate held by the chuck.

11. The substrate processing apparatus of claim 1, further comprising:
a lower nozzle configured to discharge a gas toward the substrate from below to form a flow of the gas flowing outwards in a diametrical direction from the outer periphery of the substrate held by the chuck.

12. The substrate processing apparatus of claim 1,
wherein the processing unit comprises a processing tool mounting unit to which the processing tool is mounted, and a driving unit configured to move the processing tool mounting unit back and forth in a direction in which the processing tool mounting unit is connected to or disconnected from the chuck.

13. The substrate processing apparatus of claim 12, further comprising:
a processing controller configured to move the processing tool back and forth such that a part of the outer periphery of the substrate in a circumferential direction does not come into contact with the processing tool while the substrate is being rotated along with the chuck.

14. A substrate processing apparatus, comprising:
a chuck configured to hold a substrate horizontally:
a processing unit configured to press a processing tool against an outer periphery of the substrate held by the chuck to process the substrate; and
a lower cup configured to collect a processing residue falling from the substrate over an entire circumference of the substrate,
wherein:
the lower cup is provided with a discharge opening through which the processing residue is discharged, and
the substrate processing apparatus further comprises:
an upper cover configured to be moved up and down between a closing position where the upper cover closes at least a part of an upper end opening of the lower cup and an opening position where the upper cover opens the upper end opening of the lower cup,
wherein the upper cover comprises an upper cylindrical member surrounding the outer periphery of the substrate held by the chuck, and
wherein the upper cylindrical member comprises a groove to avoid interference between the upper cylindrical member and the processing unit.

15. A substrate processing apparatus, comprising:
a chuck configured to hold a substrate horizontally:
a processing unit configured to press a processing tool against an outer periphery of the substrate held by the chuck to process the substrate; and
a lower cup configured to collect a processing residue falling from the substrate over an entire circumference of the substrate,
wherein the lower cup is provided with a discharge opening through which the processing residue is discharged,
wherein the substrate processing apparatus further comprises an upper cover configured to be moved up and down between a closing position where the upper cover closes at least a part of an upper end opening of the lower cup and an opening position where the upper cover opens the upper end opening of the lower cup,
wherein the upper cover comprises a ceiling member which closes at least the outer periphery of the substrate held by the chuck from above, and
wherein the ceiling member comprises a ring-shaped first horizontal member forming a first gap from the substrate held by the chuck, and a ring-shaped second horizontal member forming a second gap, from the substrate held by the chuck, the second gap being smaller than the first gap, the second horizontal member being located radially inside the first horizontal member.

16. A substrate processing apparatus, comprising:
a chuck configured to hold a substrate horizontally;
a processing unit configured to press a processing tool against an outer periphery of the substrate held by the chuck to process the substrate; and
a lower cup configured to collect a processing residue falling from the substrate over an entire circumference of the substrate,
wherein the lower cup is provided with a discharge opening through which the processing residue is discharged,
wherein the processing unit comprises a processing tool mounting unit to which the processing tool is mounted, and a driving unit configured to move the processing tool mounting unit back and forth in a direction in which the processing tool mounting unit is connected to or disconnected from the chuck,
wherein the processing unit comprises a first slider configured to be moved back and forth by the driving unit, a second slider configured to be moved back and forth along with the first slider, and an elastic body connecting the first slider and the second slider, and wherein the processing tool mounting unit is moved along with the second slider.

17. A substrate processing apparatus, comprising:
a chuck configured to hold a substrate horizontally:
a processing unit configured to press a processing tool against an outer periphery of the substrate held by the chuck to process the substrate; and
a lower cup configured to collect a processing residue falling from the substrate over an entire circumference of the substrate,
wherein the lower cup is provided with a discharge opening through which the processing residue is discharged, and
wherein the substrate processing apparatus further comprises a pressing device configured to press the processing residue, which is pushed up from the substrate by the processing tool, from above while maintaining a distance from the processing tool in a circumferential direction of the substrate.

18. A substrate processing method performed by using a substrate processing apparatus as claimed in claim 1 to process the substrate with the processing tool.

\* \* \* \* \*